(12) United States Patent
Takemae et al.

(10) Patent No.: US 8,541,815 B2
(45) Date of Patent: Sep. 24, 2013

(54) HIGH ELECTRON MOBILITY TRANSISTOR CIRCUIT

(75) Inventors: Yoshihiro Takemae, Yokohama (JP); Tsutomu Hosoda, Yokohama (JP); Toshiya Sato, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 2 days.

(21) Appl. No.: 13/351,869

(22) Filed: Jan. 17, 2012

(65) Prior Publication Data

US 2012/0235210 A1 Sep. 20, 2012

(30) Foreign Application Priority Data

Mar. 18, 2011 (JP) .................... 2011-060723

(51) Int. Cl.
*H01L 29/66* (2006.01)
(52) U.S. Cl.
USPC ........................................ 257/192; 257/194
(58) Field of Classification Search
USPC ................................. 257/192, 194
See application file for complete search history.

(56) References Cited

U.S. PATENT DOCUMENTS

| 6,521,961 | B1 | 2/2003 | Costa et al. |
| 8,049,252 | B2 | 11/2011 | Smith et al. |
| 8,390,000 | B2 | 3/2013 | Chu et al. |
| 2008/0124852 | A1 | 5/2008 | Ahn et al. |
| 2009/0057720 | A1 | 3/2009 | Kaneko |
| 2011/0018040 | A1 | 1/2011 | Smith et al. |
| 2011/0049526 | A1 | 3/2011 | Chu et al. |
| 2011/0057257 | A1 | 3/2011 | Park et al. |
| 2011/0089468 | A1 | 4/2011 | Zhang |
| 2011/0127604 | A1 | 6/2011 | Sato |
| 2012/0061727 | A1 | 3/2012 | Lee et al. |
| 2012/0223319 | A1 | 9/2012 | Dora |
| 2012/0267640 | A1 | 10/2012 | Wu et al. |
| 2013/0020614 | A1* | 1/2013 | Lu et al. .................... 257/194 |
| 2013/0088280 | A1* | 4/2013 | Lal et al. .................... 327/513 |

OTHER PUBLICATIONS

Saito, Wataru et al., "Field-Plate Structure Dependence of Current Collapse Phenomena in Hight-Voltage GaN-HEMTs", IEEE Electron Device Letters, vol. 31, No. 7, Jul. 1, 2010, pp. 659-661.
USPTO, (NGO) Non-Final Rejection mailed Jun. 28, 2013, in U.S. Appl. No. 13/865,448 [pending].

* cited by examiner

*Primary Examiner* — Ngan Ngo
(74) *Attorney, Agent, or Firm* — Fujitsu Patent Center

(57) ABSTRACT

A transistor circuit includes a first high electron mobility transistor and a second high electron mobility transistor having a negative threshold voltage, wherein a source of the second high electron mobility transistor is coupled to a gate of the first high electron mobility transistor, and a gate of the second high electron mobility transistor is coupled to a source of the first high electron mobility transistor.

6 Claims, 15 Drawing Sheets

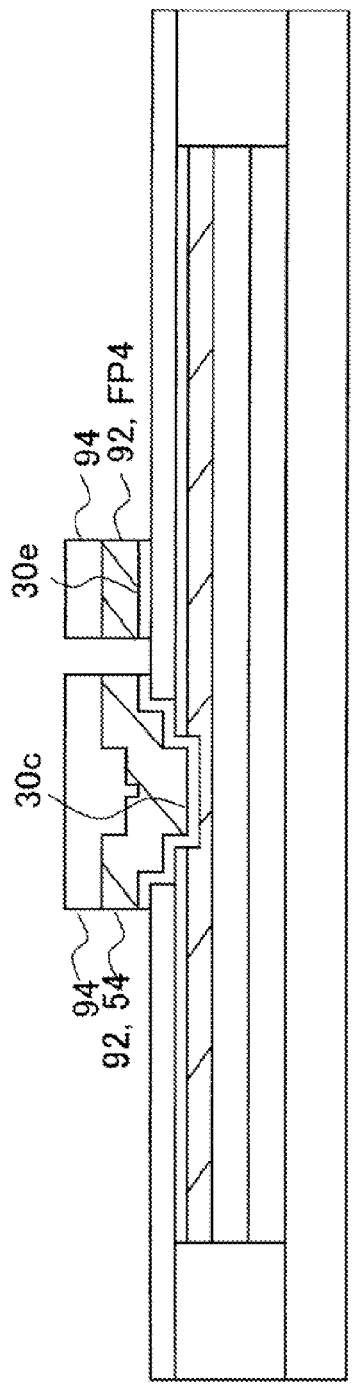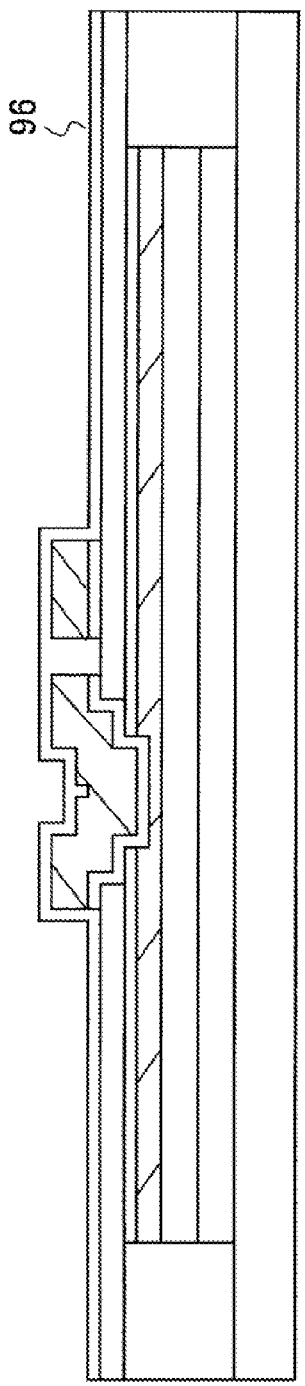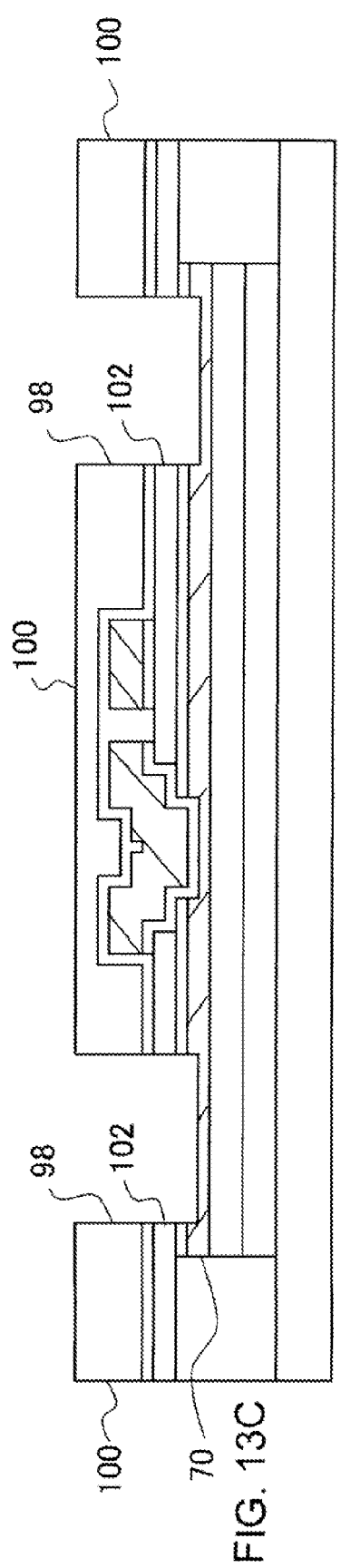
FIG. 13A
FIG. 13B
FIG. 13C

_US 8,541,815 B2_

HIGH ELECTRON MOBILITY TRANSISTOR CIRCUIT

CROSS-REFERENCE TO RELATED APPLICATION

This application is based upon and claims the benefit of priority of the prior Japanese Patent Application No. 2011-60723, filed on Mar. 18, 2011, the entire contents of which are incorporated herein by reference.

FIELD

The embodiments discussed herein are related to a semiconductor device, a method for manufacturing the semiconductor device, and a transistor circuit.

BACKGROUND

A GaN-HEMT (high electron mobility transistor) is promising as a high power switching device from high breakdown electric field intensity and high mobility of GaN. Here, a thin insulating layer is provided directly underneath the gate to drive the GaN-HEMT by a voltage of the order of several volts generated by an IC (integrated circuit). If a high voltage is applied between the source and the drain, the thin insulating layer is easily broken. In other words, the withstand voltage of the GaN-HEMT itself is not high.

To cope therewith, a semiconductor device having a field plate (FP) on the GaN-HEMT has been proposed (hereafter referred to as GaN-FP-HEMT). According to the GaN-FP-HEMT, the withstand voltage of the GaN-HEMT relative to the source-drain voltage is increased to several hundred volts. (For example, refer to Wataru Saito, "Field-Plate Structure Dependence of Current Collapse Phenomena in Hight-Voltage GaN-HEMTs", IEEE Electron device, Vol.31, July, 2010, No.7, pp.559-661, July 2010.)

SUMMARY

According to an aspect of the embodiment, a transistor circuit includes a first high electron mobility transistor and a second high electron mobility transistor having a negative threshold voltage, wherein a source of the second high electron mobility transistor is coupled to a gate of the first high electron mobility transistor, and a gate of the second high electron mobility transistor is coupled to a source of the first high electron mobility transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 13A is a process cross section illustrating an exemplary method for manufacturing a transistor circuit according to the embodiment 3;

FIG. 13B is a process cross section illustrating an exemplary method for manufacturing a transistor circuit according to the embodiment 3;

FIG. 13C is a process cross section illustrating an exemplary method for manufacturing a transistor circuit according to the embodiment 3;

EMBODIMENTS

As described previously, introducing the FP increases the withstand voltage of the GaN-HEMT relative to the source-drain voltage. However, since the thickness of the insulating layer right underneath the gate does not change, the withstand voltage of the GaN-FP-HEMT relative to the source-gate voltage is not high. Therefore, when a noise of the order of several tens of volts is applied to the gate, the GaN-FP-HEMT is broken.

Now, an electrostatic noise easily reaches several hundred volts. If such a high voltage is applied between the source and the drain, there may be cases that even the GaN-FP-HEMT, having an enhanced withstand voltage relative to the source-drain voltage by the field plate, may be broken.

As such, the high electron mobility transistor has an insufficient withstand voltage for high voltage operation.

Embodiments will be explained with reference to accompanying drawings.

Embodiment 1

(1) Structure

Figure 1:
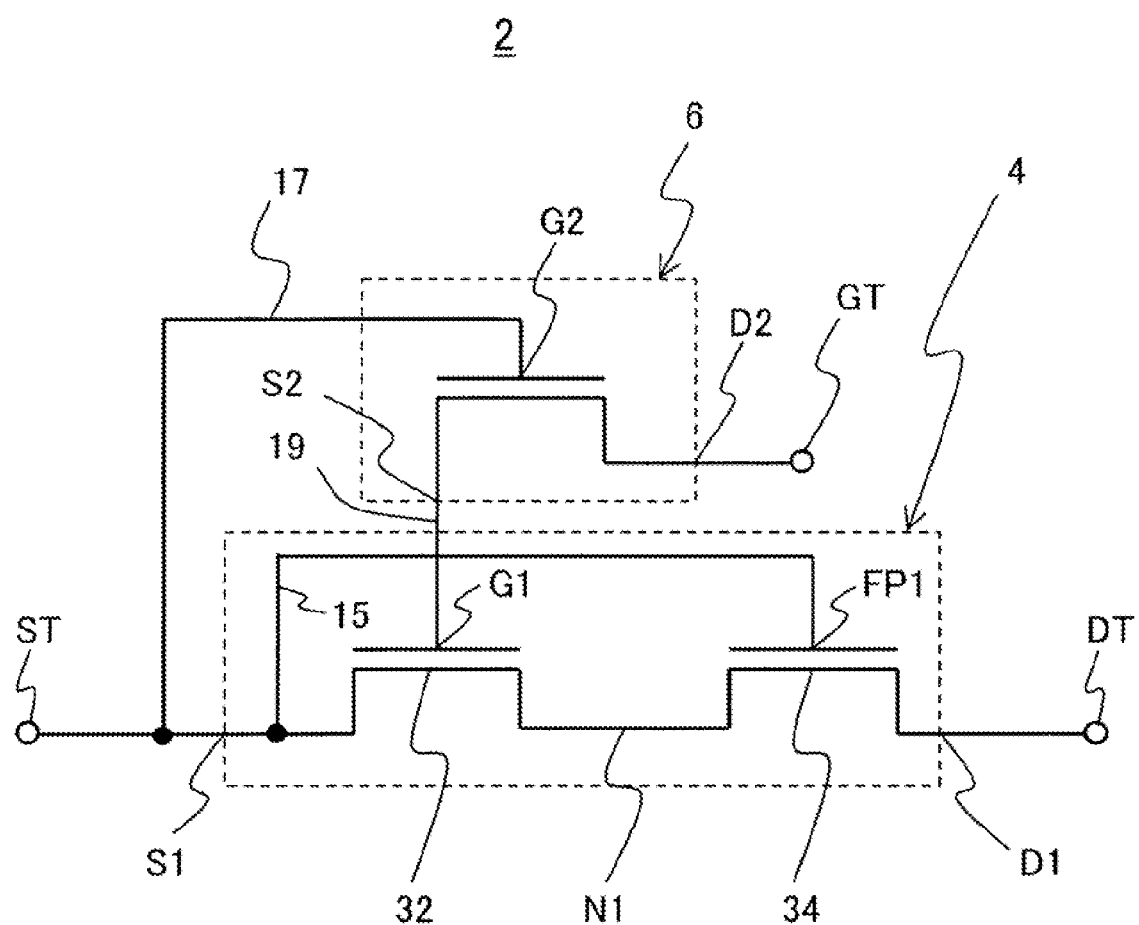
FIG. 1 is a circuit diagram of a transistor circuit according to the embodiment 1.

FIG. 1 is a circuit diagram of a transistor circuit 2 according to the present embodiment. The transistor circuit 2 includes a first high electron mobility transistor 4 and a second high electron mobility transistor 6 having a negative threshold voltage. In the frames of FIG. 1 depicted with broken lines, the equivalent circuits of the first and the second high electron mobility transistors 4, 6 are illustrated.

As illustrated in FIG. 1, the second source S2 of the second high electron mobility transistor 6 is coupled to a first gate G1 of the first high electron mobility transistor 4. Also, the second gate G2 of the second high electron mobility transistor 6 is coupled to a first source S1 of the first high electron mobility transistor 4.

Figure 2:
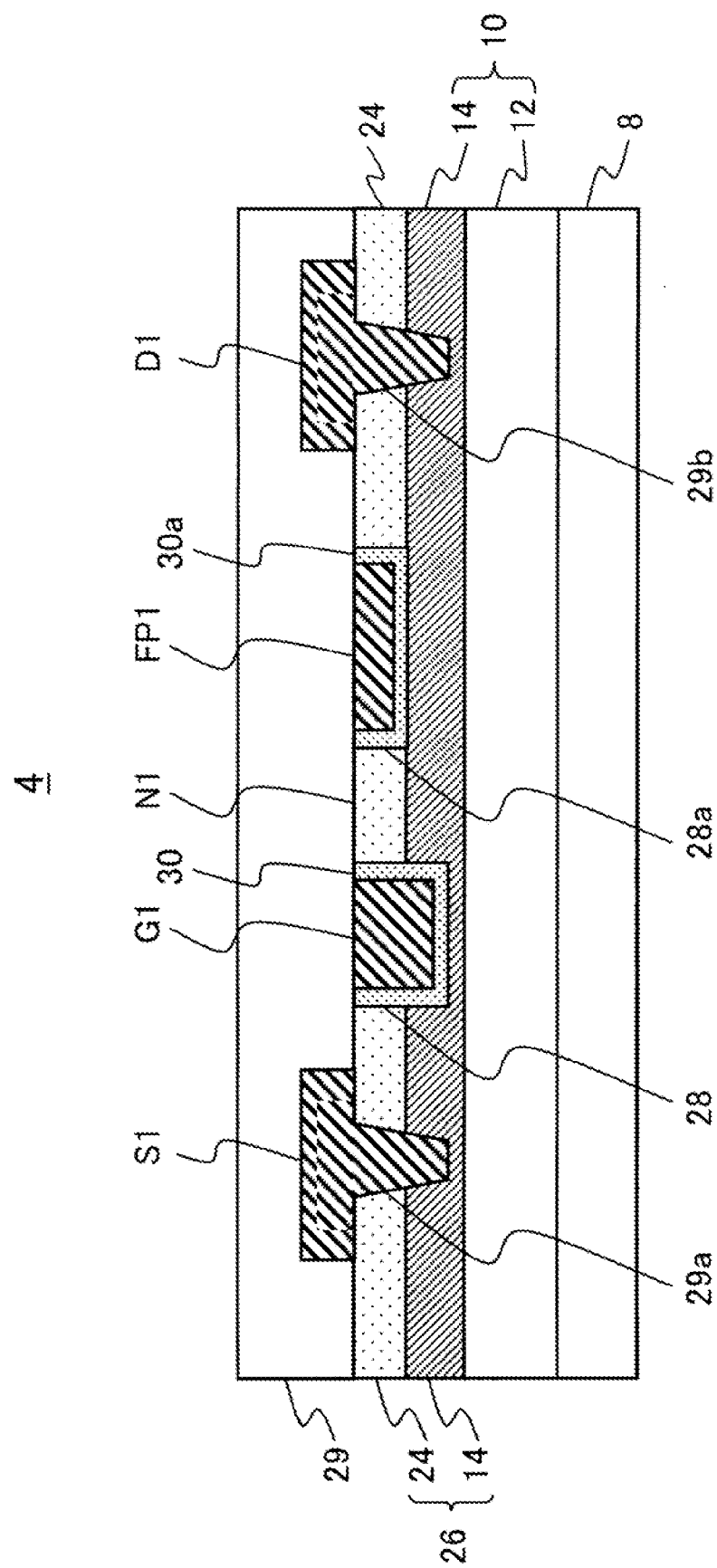
FIG. 2 is a cross section of the first high electron mobility transistor.

FIG. 2 is a cross section of the first high electron mobility transistor 4. As illustrated in FIG. 2, the first high electron mobility transistor 4 includes a semiconductor heterojunction 10 disposed on a substrate 8. The substrate 8 is, for example, a Si substrate.

As illustrated in FIG. 2, the semiconductor heterojunction 10 has a heterostructure including a channel layer 12 and a barrier layer 14 stacked thereon. The channel layer 12 is an undoped GaN layer, for example. The barrier layer 14 is either an undoped or an n-type AlGaN layer, for example. Namely, the semiconductor heterojunction 10 is an AlGaN/GaN heterojunction, for example.

In the AlGaN/GaN heterojunction, piezo polarization is produced due to lattice distortion between the AlGaN barrier layer and the GaN channel layer. By the above piezo polarization and spontaneous polarization, two-dimensional electron gas is generated at the interface between the AlGaN barrier layer and the GaN.

As illustrated in FIG. 2, the first high electron mobility transistor 4 includes a first source S1, a first gate G1, a first field plate FP1 and a first drain D1. The first FP1 is disposed between the first gate G1 and the first drain D1, and is coupled to the first source S1 by a wiring 15 (refer to FIG. 1).

As illustrated in FIG. 2, a first insulating film 24 such as a SiN film is provided on the barrier layer 14. On a laminated film 26 in which the barrier layer 14 and the first insulating film 24 are laminated, a first gate recess 28 is provided to reach the inside of the barrier layer 14.

As illustrated in FIG. 2, the first gate G1 is provided in the first gate recess 28. Further, a first gate insulating layer 30 is provided between the first gate G1 and the laminated film 26. The first gate insulating layer 30 is, for example, a laminated film including AlN film and SiN film.

Also, on the laminated film 26, an FP recess 28a is provided to reach the surface of the barrier layer 14. The field plate FP1 is provided in the FP recess 28a. Further, an FP insulating layer 30a is provided between the FP recess 28a and the laminated film 26. Similar to the gate insulating layer 30, the FP insulating layer 30a is, for example, a laminated film including AlN film and SiN film. As illustrated in FIG. 2, the above field plate FP1 extends between the first gate G1 and the first drain D1.

Further, on the laminated film 26, a source recess 29a is provided to reach the inside of the barrier layer 14. A portion of the first source S1 is provided in the source recess 29a. Also, on the laminated film 26, a drain recess 29b is provided to reach the inside of the barrier layer 14. A portion of the first drain D1 is provided in the drain recess.

On the first insulating film 24, a second insulating film 29 composed of $SiO_2$ or the like is provided, in such a manner as to cover the first source S1, the first gate G1, the first field plate FP1 and the first drain D1. By a wiring 17 (refer to FIG. 1) provided on the second insulating film 29, the first field plate FP1 is coupled to the source S1.

Figure 3:
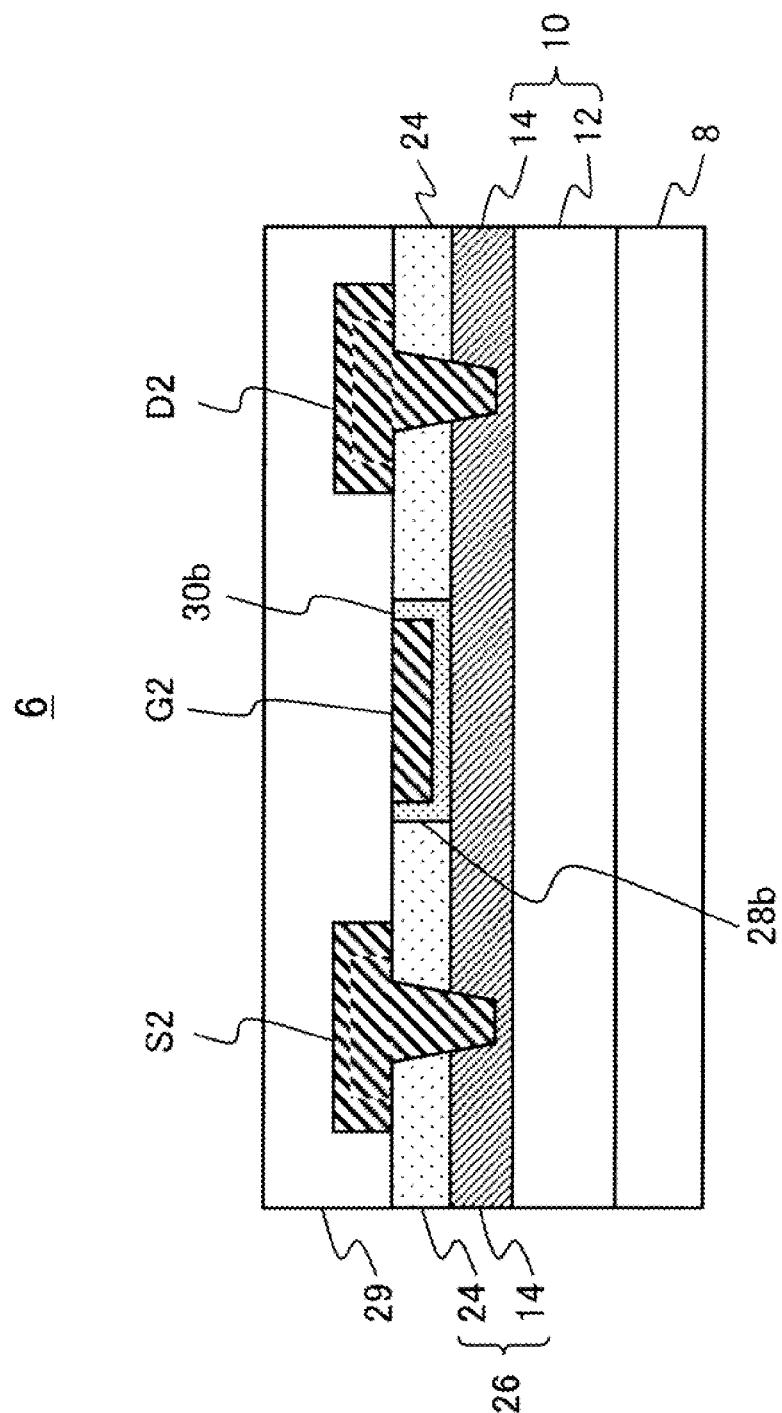
FIG. 3 is a cross section of the second high electron mobility transistor.

FIG. 3 is a cross section of the second high electron mobility transistor 6. The structure of the second high electron mobility transistor 6 is substantially identical to the structure of the first high electron mobility transistor 4, except for that it does not include the first field plate FP1 and that the second gate recess 28b virtually reaches the surface of the barrier layer 14 without penetration therefrom.

The structure of the second gate G2 of the second high electron mobility transistor 6 is substantially identical to the structure of the first field plate FP1 of the first high electron mobility transistor 4, as illustrated in FIG. 3. Namely, the second gate G2 is provided in the second gate recess 28b which is provided on the laminated film 26 to reach the surface of the barrier layer 14. A second gate insulating layer 30b is provided between the second gate recess 28b and the laminated film 26.

The first high electron mobility transistor 4 and the second high electron mobility transistor 6 are simultaneously formed on the identical substrate 8, for example. The first and the second gate insulating layers 30, 30b and the FP insulating layer 30a are formed of a single insulating layer, as an example.

A second source S2 of the second high electron mobility transistor 6 is coupled to the first source S1 of the first high electron mobility transistor 4, by means of a wiring 19 (refer to FIG. 1) provided on the second insulating film 29.

The gate G1 of the first HEMT 4 and the heterostructure 10 in the vicinity thereof (inclusive of the first gate insulating layer 30) has a function of HEMT. Also, the first field plate FP1 and the heterostructure 10 in the vicinity thereof (inclusive of the FP insulating layer 30a) has a function of HEMT. Therefore, as illustrated in FIG. 1, the equivalent circuit of the first high electron mobility transistor 4 is a series circuit including a HEMT 32 corresponding to the first gate G1 and a HEMT 34 corresponding to the first field plate FP1 (hereafter referred to as first FP-HEMT).

The threshold of the HEMT 32 corresponding to the first gate G1 is, for example, 1 to 3 V. Also, the withstand voltage of the insulating layer 30 underneath the first gate G1 relative to a voltage between the first source S1 and the first gate G1 (hereafter referred to as the withstand voltage of the first gate) is, for example, in the order of 10 V.

The threshold of the first FP-HEMT 34 is a negative voltage of, for example, −7 to −8 V. The absolute value of the threshold of the first FP-HEMT 34 (for example, 7 to 8 V) is smaller than the withstand voltage of the first gate G1 (for example, in the order of 10 V). Hereafter, the absolute value of the threshold is referred to as a threshold absolute value.

The barrier layer 14 underneath the first gate G1 is thinner than the barrier layer 14 underneath the first FP1. Accordingly, the threshold of the HEMT 32 (1 to 3 V, for example) corresponding to the first gate G1 is higher than the threshold of the first FP-HEMT (−7 to −8 V, for example). On the other hand, the withstand voltage of the first gate G1 (10 V, for example) is lower than the withstand voltage of the first field plate FP1 (100 V, for example).

Here, the withstand voltage of the first field plate FP1 is a withstand voltage of the insulating layer 30a underneath the first field plate FP1 (hereafter referred to as the withstand voltage of the first field plate FP1) relative to the source-gate voltage of the first FP-HEMT. The source-gate voltage of the first FP-HEMT is a voltage between a node N1, which is located between the first gate G1 and the first field plate FP1, and the first field plate FP1.

The second high electron mobility transistor 6 has a negative threshold voltage (for example, −7 to −8 V). Here, the threshold absolute value of the second high electron mobility transistor 6 is higher than the threshold of the HEMT 32 (for example, in the order of 1 to 3 V) corresponding to the first gate G1. Also, the withstand voltage of the gate G2 of the second high electron mobility transistor 6 (for example, in the order of 100 V) is higher than the withstand voltage of the gate G1 of the first high electron mobility transistor 4 (for example, in the order of 10 V).

Additionally, the structure underneath the second gate G2 of the second high electron mobility transistor 6 according to the present embodiment is substantially identical to the structure underneath the first field plate FP1, as illustrated in FIG. 2. Therefore, the characteristics (threshold, withstand voltage, etc.) of the second high electron mobility transistor 6 are substantially identical to the characteristics of the first FP-HEMT 34. However, the structure underneath the second high electron mobility transistor 6 may be different from the structure underneath the first field plate FP1.

Here, the withstand voltage of the gate is a withstand voltage (a voltage immediately before the occurrence of a dielectric breakdown) of the insulating layer underneath the gate, relative to the source-gate voltage of the HEMT corresponding to the gate. The withstand voltage of the field plate is a withstand voltage (a voltage immediately before the occurrence of a dielectric breakdown) of the insulating layer underneath the field plate, relative to the source-gate voltage of the HEMT corresponding to the field plate.

Hereafter, the withstand voltage of the gate and the withstand voltage of the field plate are comprehensively referred to as gate withstand voltage. Also, the breakdown of the insulating layer underneath the gate (or the field plate) is expressed as gate (or field-plate) breakdown.

Incidentally, the HEMT has a symmetric structure with respect to the gate. Accordingly, the withstand voltage of the gate (or the field plate) relative to the drain-gate voltage is substantially identical to the withstand voltage of the gate (or the field plate) relative to the source-gate voltage.

(2) Operation

As illustrated in FIG. 1, the source S1 and the drain D1 of the first high electron mobility transistor 4 are coupled to a source terminal ST and a drain terminal DT of the transistor circuit 2, respectively. The drain D2 of the second high electron mobility transistor 6 is coupled to a gate terminal GT of the transistor circuit 2. A positive voltage (of the order of several tens of volts, for example) is applied to the drain terminal DT, and the ground potential (=0 V) is supplied to the source terminal ST.

Figure 4:
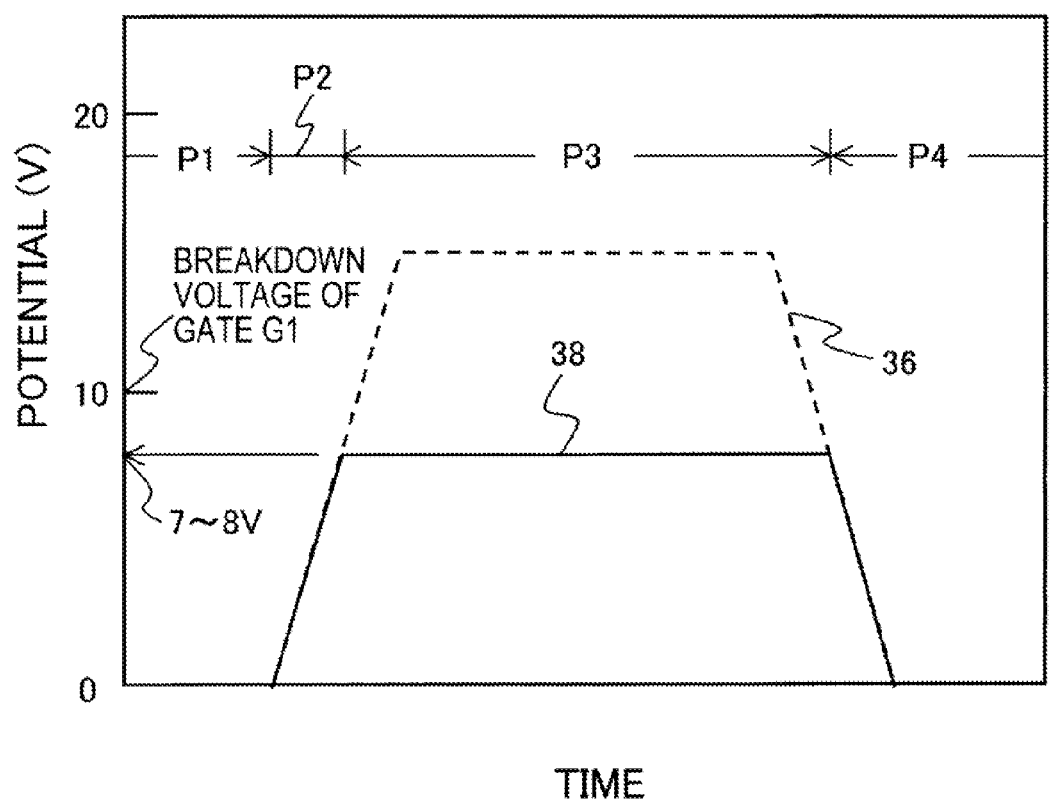
FIG. 4 is a diagram illustrating the operation of the transistor circuit according to the embodiment 1.

FIG. 4 is a diagram illustrating the operation of the transistor circuit 2 according to the present embodiment. The horizontal axis represents time. The vertical axis represents a voltage relative to the ground plane (i.e., potential). The solid lines indicate a potential 38 at the gate G1 of the first high electron mobility transistor 4. The broken lines indicate a potential 36 applied to the gate terminal GT (hereafter referred to as gate drive potential). The upper portion of FIG. 4 illustrates four phases P1-P4 corresponding to the operating states of the second high electron mobility transistor 6.

Now, a source-gate potential of the second high electron mobility transistor 6 is a potential difference between a potential $V_{S2}$ at the second source S2 and a potential $V_{G2}$ at the second gate G2 (=$V_{G2}$−$V_{S2}$). As illustrated in FIG. 1, the source S2 of the second high electron mobility transistor 6 is coupled to the first gate G1. Therefore, the potential $V_{S2}$ at the source S2 of the second high electron mobility transistor 6 equals the potential $V_{G1}$ at the first gate G1 ($V_{S2}$=$V_{G1}$).

Also, the potential $V_{G2}$ at the gate G2 of the second high electron mobility transistor 6 equals the potential $V_{S1}$ at the first source ($V_{G2}$=$V_{S1}$). Here, the potential $V_{S1}$ at the first source coupled to the source terminal ST is the ground potential (=0 V). Therefore, the potential $V_{G2}$ at the gate G2 of the second high electron mobility transistor 6 is 0 V ($V_{G2}$=0 V).

Accordingly, a source-gate potential $V_{SG}$ (=$V_{G2}$−$V_{S2}$) of the second high electron mobility transistor 6 is represented by equation (1).

$$V_{SG} = -V_{G1} \quad (1)$$

—Phase P1—

Phase P1 is a period during which a drive potential applied to the gate terminal GT (hereafter referred to as gate drive potential) is kept in a low level. In the example illustrated in FIG. 4, the low level potential (potential level to cause the transistor circuit 2 to be in a non-conductive state) is 0 V. The potential $V_{G1}$ of the first gate G1 at this time is 0 V. Therefore, as is apparent from equation (1), the source-gate potential $V_{SG}$ of the second high electron mobility transistor 6 is 0 V.

As described earlier, the threshold of the second high electron mobility transistor 6 is a negative voltage (−7 to −8 V, for example). Therefore, the second high electron mobility transistor 6 is conductive because the source-gate potential $V_{SG}$ (=0 V) is not lower than the threshold (negative voltage).

—Phase P2—

Phase P2 is a period starting from the time the gate drive potential 36 starts rising from the low level, and lasting until reaching the threshold absolute value of the second high electron mobility transistor 6. In the example illustrated in FIG. 4, the peak value of the gate drive potential (for example, in the order of 14 to 16 V) is approximately twice as large as the threshold of the first high electron mobility transistor 4 (for example, in the order of 7 to 8 V). Here, the peak value is high level potential.

When the gate drive potential starts rising, a current is supplied to the first gate G1 through the second high electron mobility transistor 6 which is in a conductive state. By the above current, the source-gate capacitance of the first high electron mobility transistor 4 is charged. As a result, the potential 38 at the first gate G1 rises together with the gate drive potential 36.

—Phase P3—

Phase 3 is a period starting from when the gate drive potential 36 further rises from the threshold absolute value of the second high electron mobility transistor 6, and after descending, lasting until returning again to the threshold absolute value of the second high electron mobility transistor 6.

When the gate drive potential 36 exceeds the threshold absolute value of the second high electron mobility transistor 6 (for example, 7 to 8 V), the potential $V_{G1}$ at the first gate G1 reaches a potential which slightly exceeds the threshold absolute value of the second high electron mobility transistor 6. Then, as is apparent from equation (1), the source-gate potential $V_{SG}$ of the second high electron mobility transistor 6 becomes slightly lower than the threshold of the second high electron mobility transistor 6. At this time, the second high electron mobility transistor 6 becomes a non-conductive state.

By this, charging the source-gate capacitance of the first high electron mobility transistor 4 is stopped. Accordingly, the potential $V_{G1}$ at the first gate G1 does not rise higher than the threshold absolute value of the second high electron mobility transistor 6 or to that degree.

Thereafter, the gate drive potential 36 reaches a high level potential, and maintains the high level potential for a while. Then, the gate drive potential 36 starts descending, and reaches again the threshold absolute value of the second high electron mobility transistor 6. During the above period, the second high electron mobility transistor 6 remains in the non-conductive state. Therefore, the potential $V_{G1}$ at the first gate G1 is maintained at the threshold absolute value of the second high electron mobility transistor 6, or to that degree.

—Phase P4—

Phase P4 is a period after the gate drive potential 36 descends to the threshold absolute value of the second high electron mobility transistor 6 or lower.

A drain-gate voltage $V_{DG}$ of the second high electron mobility transistor 6 is a potential difference between a potential $V_{D2}$ of the second drain D2 and a potential $V_{G2}$ of the second gate G2 (=$V_{G2}-V_{D2}$). As described earlier, the potential $V_{G2}$ at the second gate G2 is 0 V. Accordingly, the drain-gate voltage $V_{DG}$ of the second high electron mobility transistor 6 is represented by equation (2).

$$V_{DG} = -V_{D2} \qquad (2)$$

Therefore, when the gate drive potential 36 becomes lower than the absolute threshold of the second high electron mobility transistor 6, the drain-gate potential of the second high electron mobility transistor 6 becomes the threshold or higher. This causes the second high electron mobility transistor 6 to be conductive. Then, the source-gate capacitance of the first high electron mobility transistor 4 is discharged through the second high electron mobility transistor 6. As a result, the potential 38 of the first gate G1 descends together with the gate drive potential 36.

The discharge of the source-gate capacitance of the first high electron mobility transistor 4 continues until the gate drive potential 36 reaches the low level. When the gate drive potential 36 reaches the low level, the discharge is stopped.

As a result, the potential 38 at the first gate G1 descends to the low level potential (=0 V), and thereafter, is maintained at the low level potential. The states of the first and the second transistors 4, 6 after the gate drive potential 36 reaches the low level potential correspond to the states of the first and the second high electron mobility transistors 4, 6 at Phase P1.

—Conduction Control—

As described earlier by reference to FIG. 4, the potential 38 at the first gate G1 rises to the threshold absolute value of the second high electron mobility transistor 6 or to that degree, together with the gate drive potential 36. After remaining at approximately the threshold absolute value for a while, the potential 38 at the first gate G1 descends along with the gate drive potential 36. As described earlier, the threshold absolute value of the second high electron mobility transistor 6 (for example, 7 to 8 V) is higher than the threshold of the HEMT 32 (for example, in the order of 1 to 3 V) corresponding to the first gate G1.

Therefore, when the gate drive potential 36 reaches the high level potential, the HEMT 32 corresponding to the first gate G1 becomes conductive. Then, a potential difference between the source of the first FP-HEMT (i.e. the first node N1) and the first field plate FP1 becomes 0 V, and thus, the first FP-HEMT becomes conductive. By this, the first high electron mobility transistor 4 becomes conductive.

On the other hand, when the gate drive potential 36 reaches the low level, the HEMT 32 corresponding to the first gate G1 becomes non-conductive. Then, as will be described later, a potential difference between the source and the first field plate FP1 of the first FP-HEMT 34 becomes the threshold of the FP-HEMT 34 or less, and thus, the first FP-HEMT 34 becomes the non-conductive state. By this, the first high electron mobility transistor 4 becomes the non-conductive state.

In such a manner, the conductive state of the first high electron mobility transistor 4 is controlled by the gate drive potential 36.

—Withstand Voltage—

As described above, the peak value of the first gate potential 38 ($V_{G1}$) is as high as the absolute value ABS $V_{th}$ of the threshold of the second high electron mobility transistor 6 or to that degree. Here, the absolute threshold value ABS $V_{th}$ of the second high electron mobility transistor 6 (for example, 7 to 8 V) is lower than the withstand voltage BV (for example, in the order of 10 V) of the first gate G1 (the order of $V_{G1}$=ABS $V_{th}$<BV). Therefore, the first gate potential $V_{G1}$ is lower than the withstand voltage of the gate of the first high electron mobility transistor ($V_{G1}$<BV).

Here, the first gate potential 38 ($V_{G1}$) is a source-gate voltage of the first high electron mobility transistor 4. Therefore, according to the present transistor circuit 2, the source-gate voltage (=$V_{G1}$) of the first high electron mobility transistor 4 is limited to a voltage lower than the gate withstand voltage BV of the first high electron mobility transistor 4, by the second high electron mobility transistor 6. Accordingly, the first gate G1 is not broken by a potential applied to the gate terminal GT. In other words, the first high electron mobility transistor 4 is protected by the second high electron mobility transistor 6.

For example, the first gate G1 may not be broken even if the high level potential of the gate drive potential is higher than, inclusive of, the withstand voltage of the first high electron mobility transistor 4. Also, the first gate G1 may not be broken even when a voltage higher than, inclusive of, the withstand voltage is applied to the gate terminal GT due to a noise.

Additionally, the withstand voltage of the second high electron mobility transistor 6 is, for example, in the order of 100 V. Therefore, the second high electron mobility transistor 6 may not be broken even when a noise of the order of tens of volts is applied to the gate terminal GT.

As such, in the semiconductor device 2 according to the present embodiment, the second high electron mobility transistor 6 limits a voltage between the source and the gate of the first high electron mobility transistor 4 to a voltage smaller than the gate withstand voltage of the first high electron mobility transistor 4. By this, the breakage of the first high electron mobility transistor 4 is prevented. Here, the "a voltage between the source and the gate" means a value equivalent to the absolute value of a voltage between the source and the gate.

In the above-mentioned description, a case that a positive potential is applied to the gate terminal GT is assumed. In this case, the positive potential is applied to the first gate G1, by which two-dimensional electron gas is generated in the channel layer 12 underneath the gate. By this, a large electric field is applied to the insulating layer 30 and the barrier layer 14, which causes easy breakage of the insulating layer 30 and the barrier layer 14. According to the present embodiment, by providing the second high electron mobility transistor 6, the electric field applied to the insulating layer 30 and the barrier layer 14 is limited, so that the breakage of the insulating layer 30 and the barrier layer 14 is prevented.

On the other hand, when a noise having a potential changed to be negative is input to the gate terminal GT, a negative potential is also applied to the first gate G1. In this case, the two-dimensional electron gas is not generated, and a depletion layer is expanded in the channel layer 12. By this, the electric field applied to the insulating layer 30 and the barrier layer 14 is hard to be strengthened. Therefore, though any special measure is taken, the transistor circuit 2 according to the present embodiment may not be easily broken if a noise having a potential changed to be negative is input to the gate terminal.

—Field Plate FP1—

As illustrated in FIG. 1, the first node N1 exists between the first field plate FP1 and the first gate G1. In a state that a high level potential is applied to the gate terminal GT, the HEMT 32 corresponding to the first gate G1 and the first FP-HEMT 34 are conductive. At this time, a potential at the first node N1 is approximately 0 V.

When a low level potential is applied to the gate terminal GT, the HEMT 32 corresponding to the first gate G1 becomes a non-conductive state. Then, a parasitic capacitance (not illustrated) parasitic on the first node N1 is charged via the first FP-HEMT 34.

By this charge, the potential at the first node N1 rises. When the potential at the first node N1 slightly exceeds the threshold absolute value of the first FP-HEMT 34 (for example, in the order of 7 to 8 V), the source-gate voltage of the first FP-HEMT 34 becomes slightly lower than the threshold thereof. This makes the first FP-HEMT 34 non-conductive, and also the parasitic capacitance not charged any more. As a result, the potential at the first node N1 becomes the threshold absolute value of the first FP-HEMT 34 or to that degree.

The threshold absolute value of the first FP-HEMT 34 (for example, in the order of 7 to 8 V) according to the present embodiment is lower than the gate withstand voltage of the HEMT 32 (for example, in the order of 10 V) corresponding to the first gate G1. Accordingly, the first high electron mobility transistor 4 may not be broken even when a potential (of several tens volts, for example) higher than the withstand voltage of the HEMT 32 corresponding to the first gate G1 (relative to the source-drain voltage) is applied to the drain terminal DT. In other words, the HEMT 32 corresponding to the first gate G1 is protected by the first FP-HEMT 34.

Additionally, when the withstand voltage of the first high electron mobility transistor 4 is sufficiently high, or when a large voltage is not applied to the drain terminal DT, the first FP-HEMT FP1 is not needed.

Incidentally, when the high electron mobility transistor is in a conductive state, the drain potential is substantially 0 V. Therefore, the gate may not be broken. On the other hand, if the field plate is not provided, the gate may easily be broken when the high electron mobility transistor becomes non-conductive. In that case, when the high electron mobility transistor becomes non-conductive, an increase of the drain potential results in breakage of the gate.

In the above example, the threshold of the HEMT 32 corresponding to the first gate G1 is a positive voltage. However, the threshold of the HEMT 32 corresponding to the first gate G1 may also be a negative voltage.

Also, in the above example, the ground potential is supplied to the source terminal ST. However, either a positive potential or a negative potential may be supplied to the source terminal ST. In that case, the transistor circuit 2 is operated substantially in the same manner as in the above description, only by substituting the potential supplied to the source terminal ST, from the ground potential to the negative potential or the positive potential. The gate withstand voltage of the transistor circuit 2 also becomes higher, for the same reason as described above.

(3) Deformation Example

Figure 5:
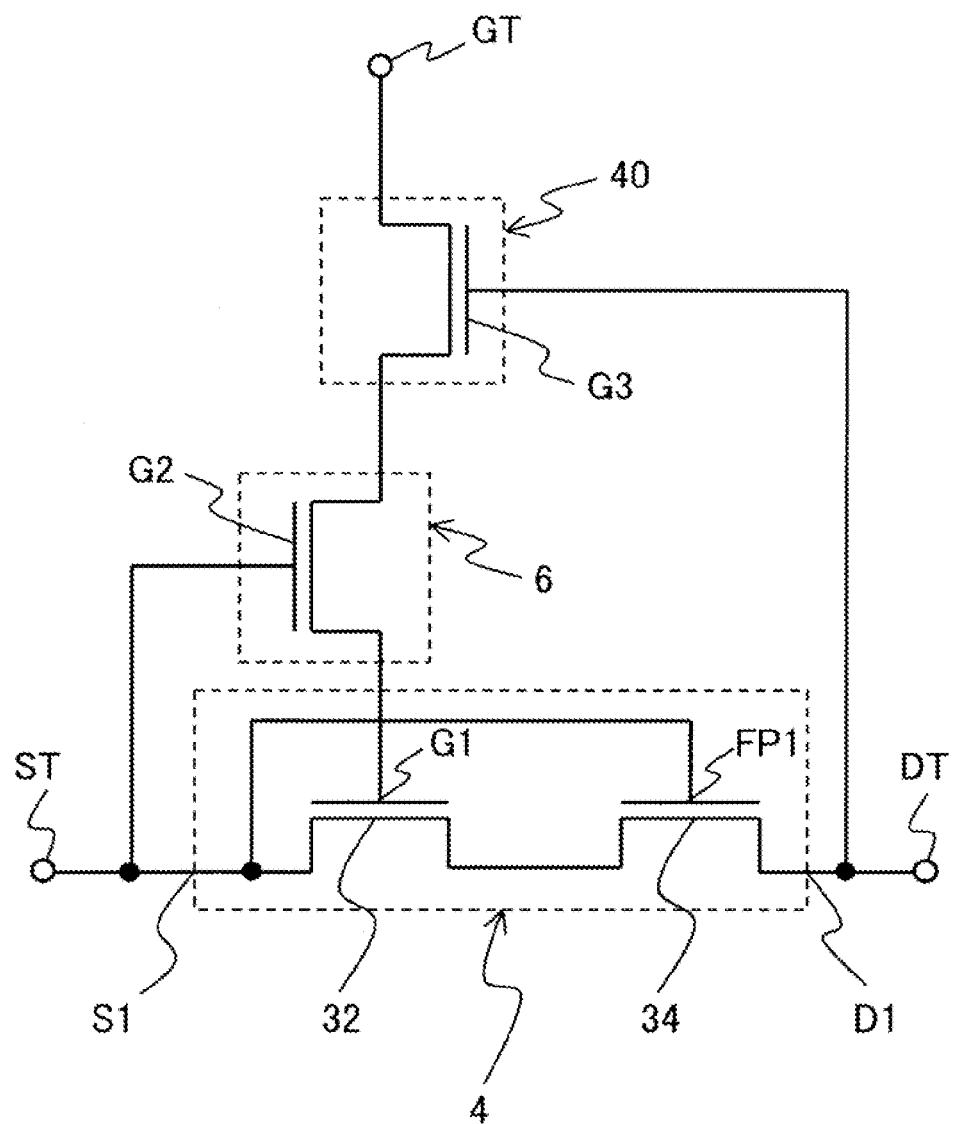
FIG. 5 is a circuit diagram illustrating a deformation example of the embodiment 1.

FIG. 5 is a circuit diagram illustrating a deformation example 2a of the present embodiment. In the deformation example 2a, a third high electron mobility transistor 40 coupled in series with the second high electron mobility transistor 6 is provided, as illustrated in FIG. 5.

A third gate G3 of the third high electron mobility transistor 40 is coupled to the first drain D1 of the first high electron mobility transistor 4. The threshold of the third high electron mobility transistor 40 is a negative voltage. Also, the threshold absolute value of the third high electron mobility transistor 40 is higher than the threshold of the first high electron mobility transistor 4, and is lower than the gate withstand voltage of the first high electron mobility transistor 4. Such characteristics are obtained by configuring the third high electron mobility transistor 40 with a structure substantially identical to that of the second high electron mobility transistor 6.

In the aforementioned "(2) Operation", as a premise, the potential at the source terminal ST is lower than the potential at the drain terminal DT. However, the potential at the source terminal ST is not always lower than the potential at the drain terminal DT. For example, when a large noise current flows in wiring which connects the ground plane to the source terminal ST, there is a case that the potential at the source terminal ST is higher than the potential at the drain terminal DT.

In this case, the second high electron mobility transistor 6 does not easily become a non-conductive state, because a high potential at the source terminal ST is applied to the gate of the second high electron mobility transistor 6. Therefore, it is difficult for the second high electron mobility transistor 6 to limit the potential rise of the first gate G1, when a gate drive potential is applied to the gate terminal GT.

In contrast, the third high electron mobility transistor 40 including the gate G3 coupled to the drain terminal DT of a lower potential side easily becomes a non-conductive state. Therefore, if the gate drive potential rises, the third high electron mobility transistor 40 becomes the non-conductive state, and the potential rise of the first gate G1 is limited.

At this time, a potential difference between the first gate G1 and the first source S1, or the source-gate voltage, is limited to the threshold absolute value of the third high electron mobility transistor 40 or to that degree. The above threshold absolute value is lower than the withstand voltage of the first high electron mobility transistor 4. Therefore, according to the deformation example 2a, it is possible to prevent the breakage of the first gate G1, even if the potential at the source terminal ST becomes higher than the potential at the drain terminal.

Further, the threshold absolute value of the third high electron mobility transistor 40 is higher than the threshold of the HEMT 32 corresponding to the first gate G1. Therefore, the third high electron mobility transistor 40 does not prevent the conduction of the first high electron mobility transistor 4. Here, the third high electron mobility transistor 40 may also be provided between the first gate G1 and the second high electron mobility transistor 6.

Embodiment 2

Figure 6:
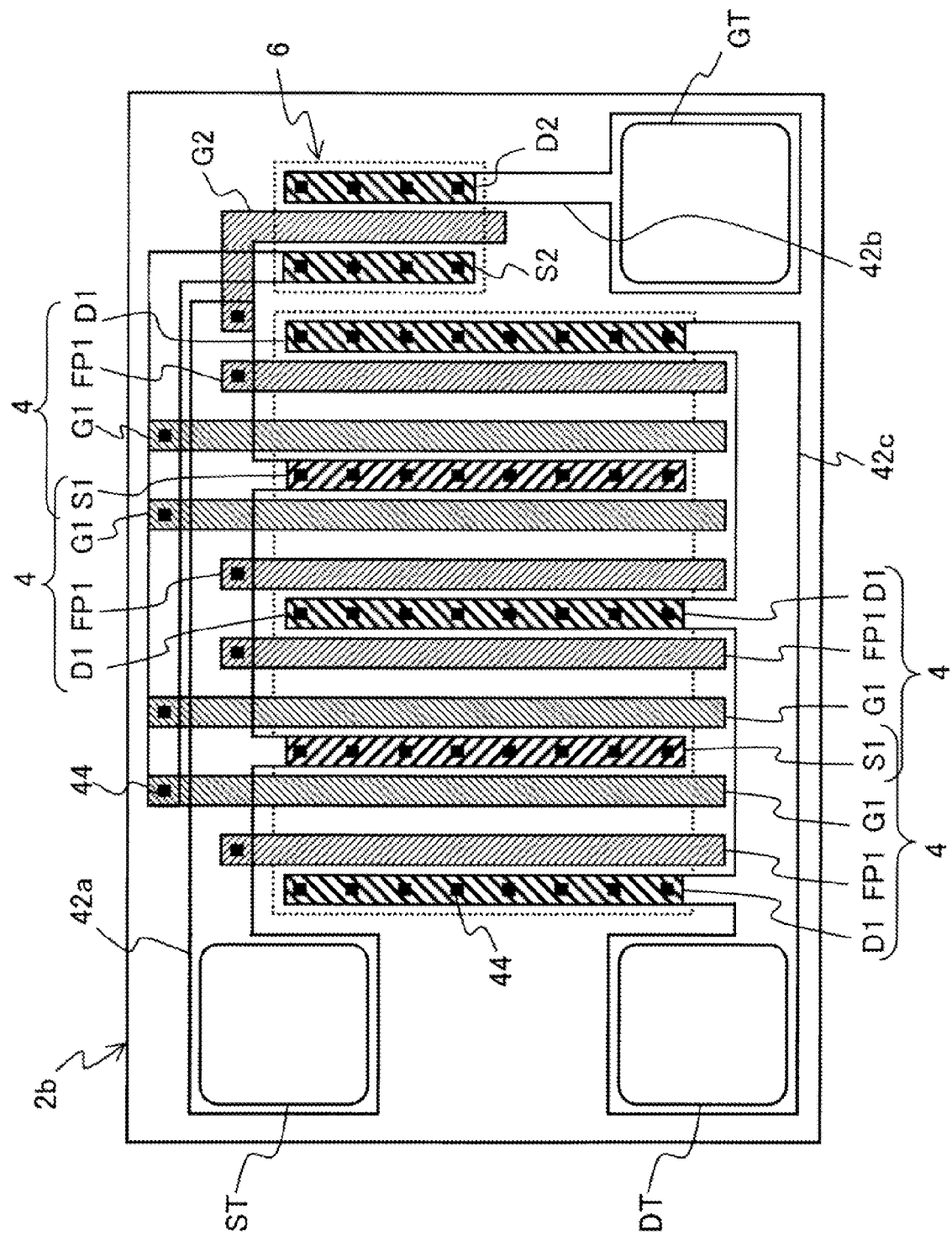
FIG. 6 is a plan view of a transistor circuit according to the embodiment 2.

FIG. 6 is a plan view of a transistor circuit 2b according to the present embodiment. In the embodiment 1, one first high electron mobility transistor 4 is coupled to one second high electron mobility transistor 6. On the other hand, in the transistor circuit 2b according to the present embodiment, a plurality of first high electron mobility transistors 4 are coupled to the one second high electron mobility transistor 6, as illustrated in FIG. 6. Here, the first and the second high electron mobility transistors 4, 6 are devices formed on an identical substrate.

The structures of the first and the second high electron mobility transistors 4, 6 are substantially identical to the structures of the first and the second high electron mobility transistors according to the embodiment 1 which have been described by reference to FIGS. 2, 3. A region located between a region including the plurality of first high electron mobility transistors 4 and a region including the second high electron mobility transistor 6 is formed to have high resistance by ion injection, for example.

Source terminal ST, drain terminal DT and gate terminal GT are electrode pads provided in a second insulating film 29 (refer to FIGS. 2, 3). To the above electrode pads, wirings 42a, 42b, 42c provided on the second insulating film 29 are coupled. To the wirings 42a, 42b, 42c, there are coupled the first and the second sources S1, S2, the first and the second drains D1, D2, the first and the second gates G1, G2 and a field plate FP1 (hereafter referred to as the first source S1, S2, etc). The first source S1, S2, etc. and the wirings 42a, 42b, 42c are coupled by extraction electrodes 44 provided on the second insulating film 29. Here, in FIG. 6, the first source S1, S2, etc. are drawn in a state the second insulating film 29 is seen through.

The structures of the first and the second high electron mobility transistors 4, 6 are substantially identical to the structures of the first and the second high electron mobility transistors explained in the embodiment 1, as described above. However, the first source S1 and the first drain D1 of each first high electron mobility transistor 4 are shared by each adjacent first high electron mobility transistor 4.

As illustrated in FIG. 6, in the transistor circuit 2b according to the present embodiment, the plurality of first high electron mobility transistors 4 are coupled to the source terminal ST and the drain terminal DT. Therefore, high output power is obtainable.

Figure 7:
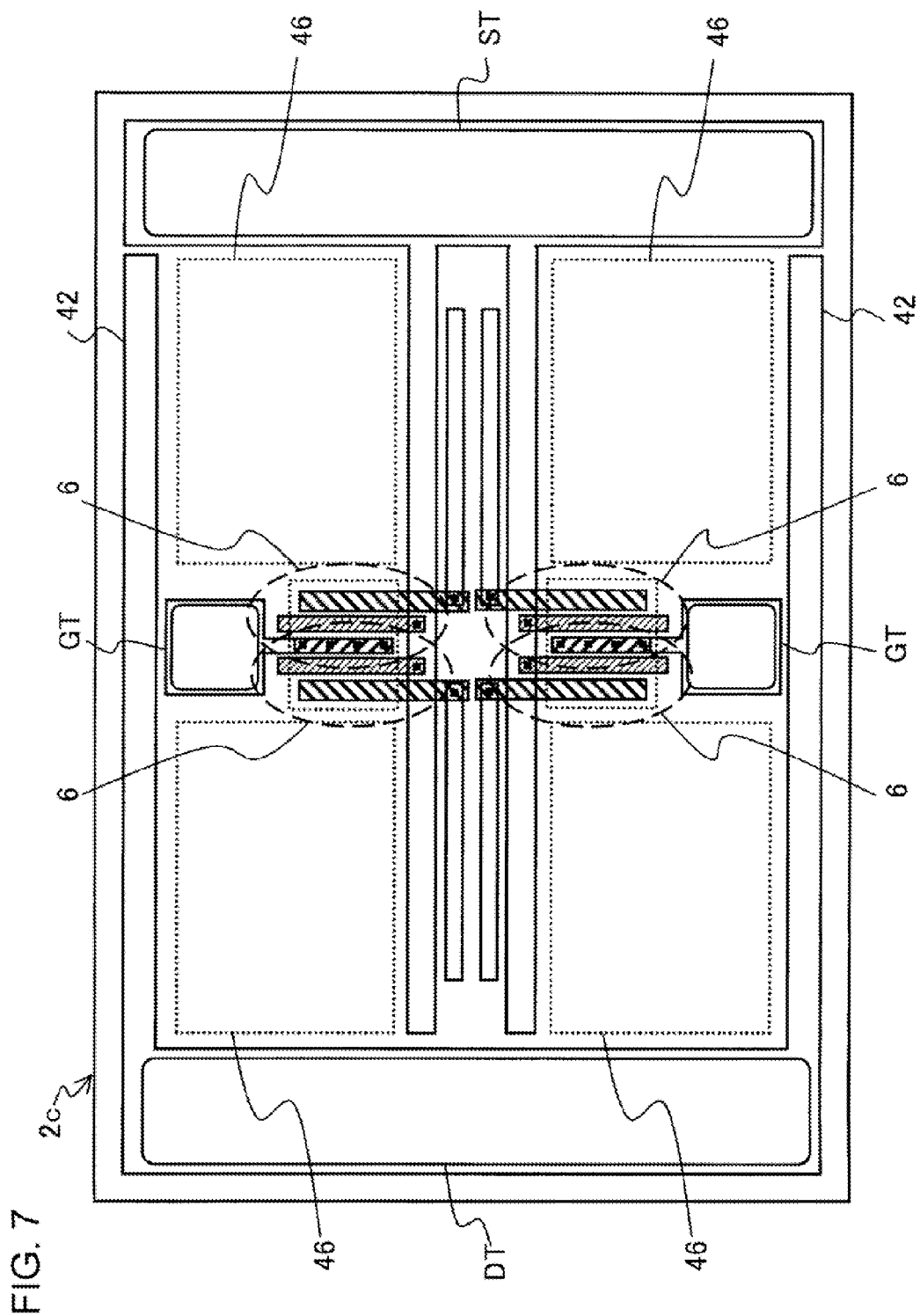
FIG. 7 is a plan view of a deformation example of the embodiment 2.

FIG. 7 is a plan view of a deformation example 2c of the present embodiment. In the deformation example 2c, a plurality of second high electron mobility transistors 6 are disposed in the central portion of the transistor circuit 2c. Further, in the deformation example 2c, a plurality of transistor regions 46 including a plurality of first high electron mobility transistors 4 (not illustrated) are provided.

The plurality of second transistors 6 are respectively coupled to a plurality of first high electron mobility transistors 4 each included in any one of the plurality of transistor regions 46. Accordingly, the plurality of second high electron mobility transistors 6 disposed in the central portion share the limitation of the gate voltage rise of the first high electron mobility transistor 4 provided in the deformation example 2c.

Because of the influence of the resistance and the parasitic capacitance of the wirings 42a, 42b, 42c, voltages to be applied to the first high electron mobility transistors 4 differ device by device. By this, abnormal operation may easily occur in the transistor circuit having the plurality of first high electron mobility transistors 4.

Voltage dispersion applied to the first high electron mobility transistors 4 is apt to be large at both ends of the transistor circuit 2c. To cope therewith, according to the present embodiment, the dispersion of the applied voltage is mitigated by the disposition of the plurality of second high electron mobility transistors 6 in the central portion, as illustrated in FIG. 7. By this, the abnormal operation of the first high electron mobility transistors 4 is suppressed.

Additionally, the dispersion of the applied voltage may be mitigated simply by the disposition of the plurality of second high electron mobility transistors 6 in a distributed manner.

Embodiment 3

Figure 8:
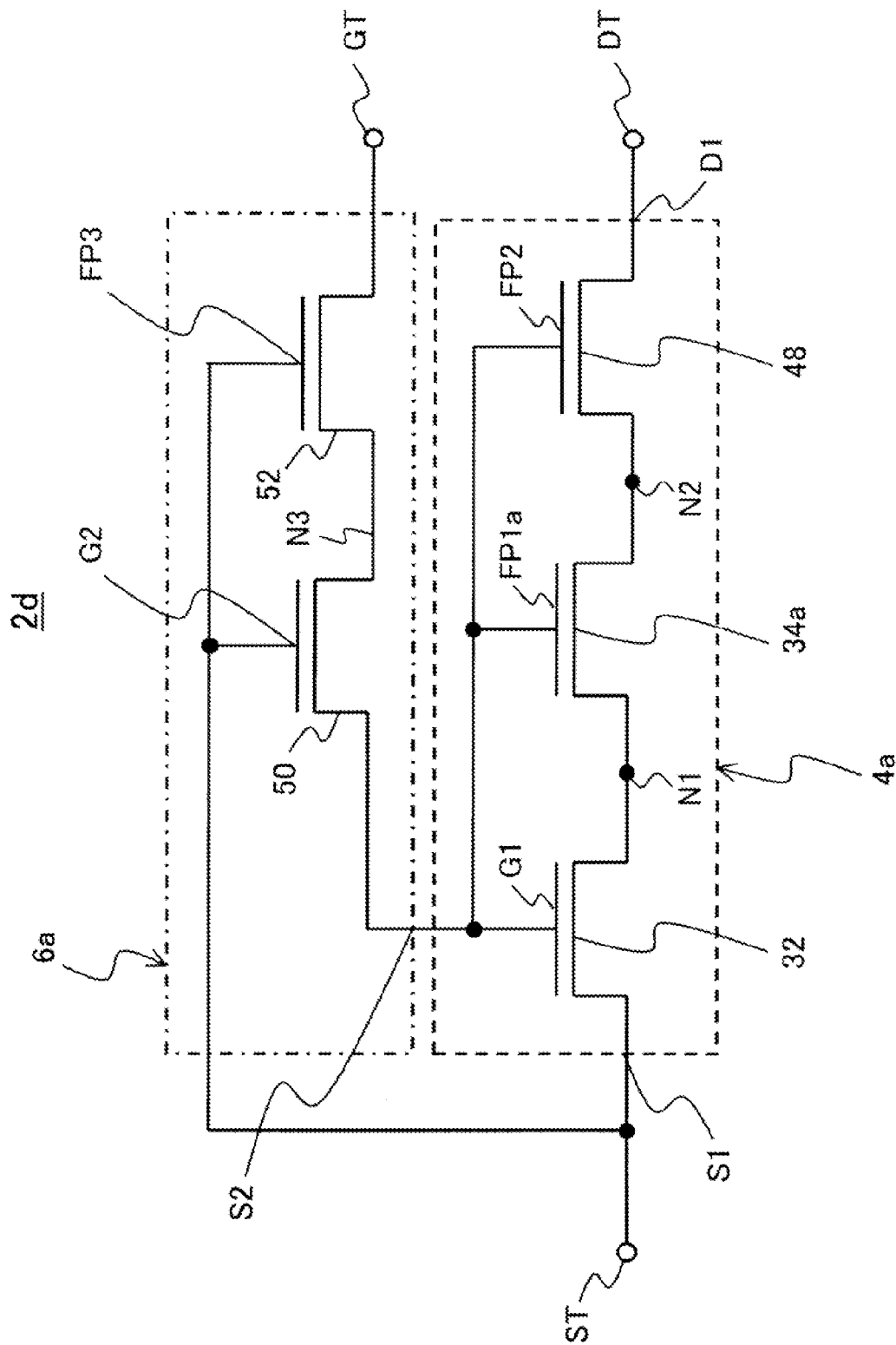
FIG. 8 is a circuit diagram of a transistor circuit according to the embodiment 3.

FIG. 8 is a circuit diagram of a transistor circuit 2d according to the present embodiment. As illustrated in FIG. 8, the transistor circuit 2d resembles the transistor circuit 2 of the embodiment 1. Therefore, the description of portions common to the transistor circuit 2 of the embodiment 1 will be omitted.

As illustrated in FIG. 8, the transistor circuit 2d includes a first high electron mobility transistor 4a and a second high electron mobility transistor 6a.

(1) First High Electron Mobility Transistor

The first high electron mobility transistor 4a includes a first gate G1, a first field plate FP1a, and a second field plate FP2.

Similar to the first field plate FP1 in the embodiment 1, the first field plate FP1a is a field plate provided between the first gate G1 and a first drain D1. The first field plate FP1a may be a field plate of which one portion extends between the first gate G1 and the first drain D1 (refer to "Gate and field plate structures" described later).

The second field plate FP2 is a field plate provided between the first field plate FP1a and the first drain D1. The field plate FP2 may be a field plate of which one portion extends between the first field plate FP1a and the first drain D1 (refer to "Gate and field plate structures" described later).

As illustrated in FIG. 8, the first high electron mobility transistor 4a includes a HEMT 32 corresponding to the first gate G1, a first FP-HEMT 34a corresponding to the first field plate FP1a, and a second FP-HEMT 48 corresponding to the second field plate FP2.

Similar to the embodiment 1, the HEMT 32 corresponding to the first gate G1 has a positive threshold (for example, 1 to 3 V). Also, the first FP-HEMT 34a has a negative threshold voltage (for example, in the order of −7 to −8 V). The second FP-HEMT 48 has a negative threshold voltage (for example, in the order of −80 V) which is lower than the threshold of the first FP-HEMT 34a.

Also, similar to the embodiment 1, a source terminal ST is grounded, and a positive potential is supplied to a drain terminal DT. On the other hand, the first field plate FP1a is coupled to the first gate G1, differently from the first field plate FP1 in the embodiment 1. Also, the second field plate FP2 is coupled to the first gate G1.

When a low level potential (for example, 0 V) is applied to the first gate G1, the HEMT 32 corresponding to the first gate G1 becomes non-conductive. The potential of the first field plate FP1a at this time is a low level potential. Therefore, the potential at a first node N1 (node between the first gate G1 and the first field plate FP1a) rises to a potential in which the threshold absolute value of the first FP-HEMT 34a (for example, 7 to 8 V) is added to the low level potential (for example, 0 V).

The threshold absolute value of the first FP-HEMT 34a (for example, in the order of 7 to 8 V) is lower than the gate withstand voltage of the first gate G1 (for example, in the order of 10 Vr), similar to the embodiment 1. Therefore, the first gate G1 is not broken by the potential at the first node N1.

Similarly, when the low level potential is applied to the first gate G1, the potential at a second node N2 rises to a potential in which the threshold absolute value of the second FP-HEMT 48 (for example, in the order of 80 V) is added to the low level potential (for example, in the order of 0 V). The second node N2 is a node between the first field plate FP1a and the second field plate FP2.

The threshold absolute value of the second FP-HEMT 48 (for example, 80 V or of that order) is lower than the gate withstand voltage of the first FP-HEMT 34a (for example, 100 V or of that order). Therefore, the first FP1a is not broken by the potential at the second node N2.

The gate withstand voltage of the second field plate FP2 (for example, in the order of 1 kV) is higher than the gate withstand voltage of the first FP-HEMT 34a (for example, in the order of 100 V). Therefore, the second FP-HEMT 48 may not be broken even if a potential higher than the gate withstand voltage of the first field plate FP1a is applied to the drain terminal DT.

Therefore, according to the present embodiment, the withstand voltage of the transistor circuit 2d relative to a voltage between the source terminal ST and the drain terminal DT becomes higher than the withstand voltage of the transistor circuit in the embodiments 1 and 2 including no second field plate FP2. For example, the transistor circuit 2d may not be broken even if a noise voltage of the order of several hundred volts is input to the drain terminal DT.

(2) Second High Electron Mobility Transistor

The second high electron mobility transistor 6a includes a second gate G2 and a third field plate FP3. The second gate G2 and the third field plate FP3 are coupled to the source S1 of the first high electron mobility transistor 4a.

The third field plate FP3 is a field plate provided between the second gate G2 and the gate terminal GT. The third field plate FP3 may also be a field plate of which portion extends between the second gate G2 and the gate terminal GT (refer to the "Gate and field plate structures" described later).

As illustrated in FIG. 8, the second high electron mobility transistor 6a includes a HEMT 50 corresponding to the second gate G2 and a third FP-HEMT 52 corresponding to the third field plate FP3.

Similar to the embodiment 1, the HEMT 50 corresponding to the second gate G2 has a negative threshold voltage (for example, in the order of −7 to −8). The third FP-HEMT 52 has a negative threshold voltage (for example, in the order of −80 V) lower than the threshold voltage of the HEMT 50 corresponding to the second gate G2.

In a state that a low level potential is applied to the gate terminal GT, the HEMT 50 corresponding to the second gate G2 and the third FP-HEMT 52 are conductive. When a potential applied to the gate terminal GT rises, the source-gate capacitance of the HEMT 32 corresponding to the first gate G1 is charged. As a result, the source potential of the HEMT 50 corresponding to the second gate G2 rises.

When the gate drive potential (potential applied to the gate terminal GT) exceeds the threshold absolute value of the HEMT 50 corresponding to the second gate G2, the source-gate voltage thereof becomes lower than the threshold. Therefore, the HEMT 50 corresponding to the second gate G2 becomes a non-conductive state. As a result, the potential at the first gate G1 is fixed approximately to the threshold absolute value of the HEMT 50 corresponding to the second gate G2.

When the gate drive potential further rises to exceed the threshold absolute value of the third FP-HEMT 52, the third FP-HEMT 52 becomes a non-conductive state. As a result, the potential at the third node N3 between the second gate G2 and the third field plate FP3 is fixed to the threshold absolute value of the third FP-HEMT 52, or to that degree.

The threshold absolute value of the HEMT 50 (for example, in the order of 7 to 8 V) corresponding to the second gate G2 is lower than the gate withstand voltage of the HEMT 32 (for example, in the order of 10 V) corresponding to the first gate G1, similar to the embodiment 1. Therefore, the first gate is not broken by the potential at the second source S2 (i.e. the potential at the first gate G1).

Also, the threshold absolute value of the third FP-HEMT 52 (for example, in the order of 80 V) is lower than the gate withstand voltage of the HEMT 50 (for example, in the order of 100 V) corresponding to the second gate G2. Therefore, the second gate G2 is not broken by the potential at the third node N3.

The withstand voltage of the third field plate (for example, in the order of 1 kV) is higher than the withstand voltage of the second gate G2 (for example, in the order of 100 V). Therefore, the third FP-HEMT 52 may not be broken even if a potential (for example, several hundred volts) higher than the withstand voltage of the second gate G2 is applied to the gate terminal GT.

Therefore, according to the present embodiment, the withstand voltage of the first gate G1 relative to the voltage between the source terminal ST and the gate terminal GT becomes higher than the withstand voltage of the transistor circuit according to the embodiments 1 and 2 including no third FP-HEMT 52. For example, the transistor circuit 2d may not be broken even if a noise voltage of the order of several hundred volts is input to the gate terminal GT.

(3) Gate and Field Plate Structures

Figure 9:
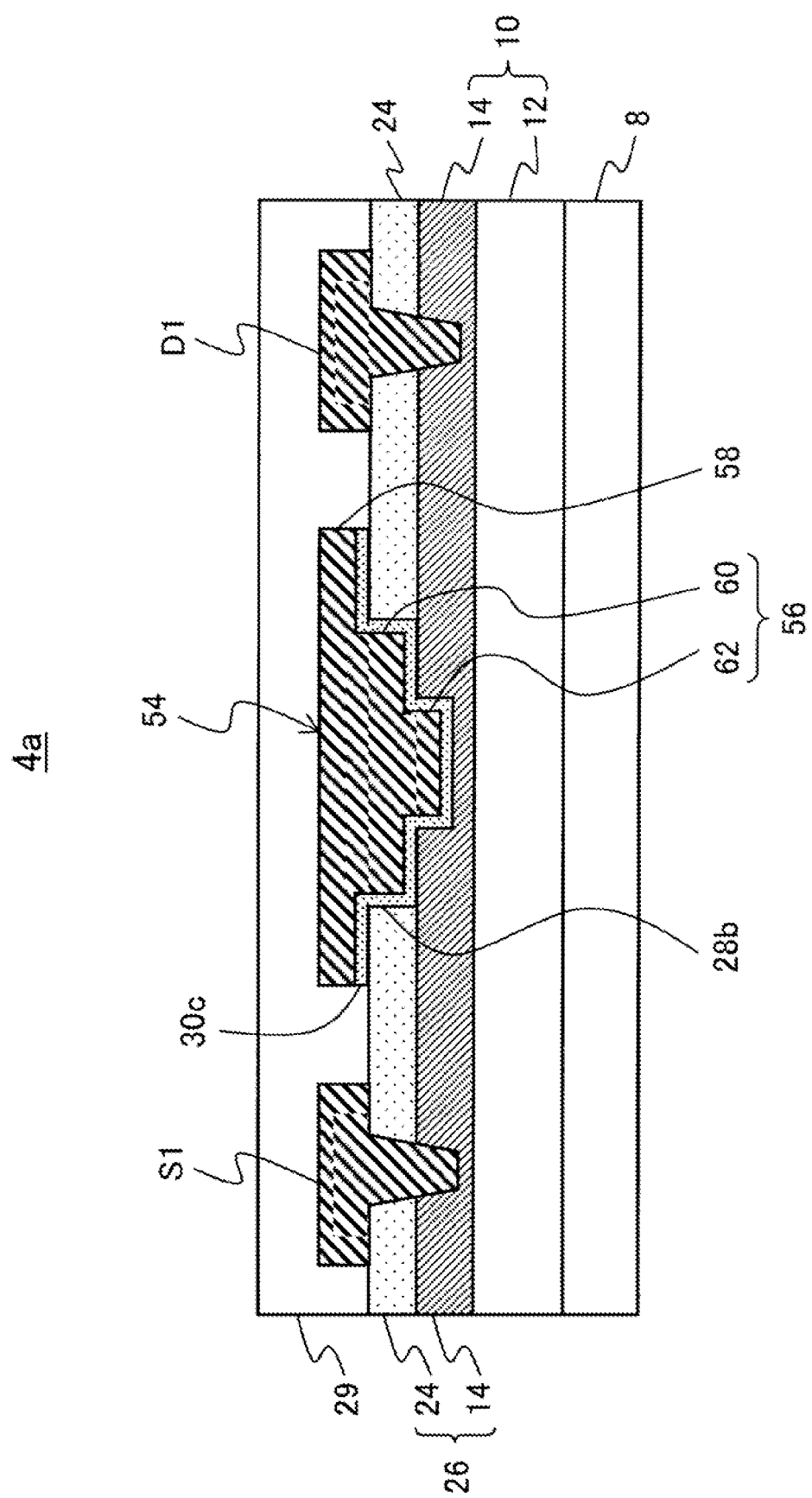
FIG. 9 illustrates an exemplary cross-sectional view of the first high electron mobility transistor.

FIG. 9 illustrates an exemplary cross-sectional view of the first high electron mobility transistor 4a.

As illustrated in FIG. 9, the first high electron mobility transistor 4a includes a first compound semiconductor film (channel layer 12) and a laminated film 26. In the laminated film 26, a second compound semiconductor film (barrier layer 14) and a first insulating film 24 are laminated.

The first high electron mobility transistor 4a includes a first electrode 54 disposed between the first source S1 and the second drain D1. The first electrode 54 includes a first portion 56 embedded in a first recess 28b formed on the laminated film 26, and a plate-shaped second portion 58 extending on both the first portion 56 and the first insulating film 24. A third gate insulating layer 30c is provided between the first electrode 54 and the laminated film 26. The second portion 58 has a certain length (for example, 0.1 to several μm).

The first portion 56 includes a plate-shaped first embedded portion 60 having a first length (for example, 0.1 to several μm) in the extending direction of the second portion 58. Also, the first portion 56 includes a plate-shaped second embedded portion 62 disposed between the first embedded portion 60 and the bottom of the first recess 28b with a second length (for example, 0.1 μm or greater), which is smaller than the first length, in the above-mentioned extending direction. As illustrated in FIG. 9, the above extending direction is a direction from the source S1 toward the drain D1 of the first high electron mobility transistor 4a.

In the example illustrated in FIG. 9, the first recess 28b reaches inside the barrier layer 14. However, the first recess 28b may not reach inside the barrier layer 14. In other words, the first recess 28b may be stopped at the surface of the barrier layer 14 or inside the first insulating film 24. When the first recess 28b is stopped inside the first insulating film 24, the third gate insulating layer 30c may be omitted.

The second embedded portion 62 is the first gate G1. The first embedded portion 60 is the first field plate FP1. The second portion 58 is the second field plate FP2. The first embedded portion 60, the second embedded portion 62 and the second portion 58 are integrally formed and coupled to each other.

As illustrated in FIG. 9, the first field plate FP1 (the first embedded portion 60) expands to both sides of the first gate G1 (the second embedded portion 62). One side of the above expanding portion (a portion of the first field plate FP1) extends between the first gate G1 (the second embedded portion 62) and the first drain D1, as illustrated in FIG. 9. The above portion functions as a field plate, so as to limit a potential at a boundary between with the first gate G1 to the threshold absolute value of the first field plate FP1 or to that degree.

Further, the second field plate FP2 (the second portion 58) expands to both sides of the first field plate FP1 (the first embedded portion 60). One side of the above expansion (a portion of the second field plate FP2) extends between the first field plate FP1 (the first embedded portion 60) and the first drain D1. One side of the above expansion functions as a field plate, and limits a potential at a boundary between with the first field plate FP1 to the threshold absolute value of the second field plate FP2, or to that degree.

Namely, the first electrode 54 is an electrode in which the first gate G1, the first field plate FP1, and the second field plate FP2 are combined.

Figure 10:
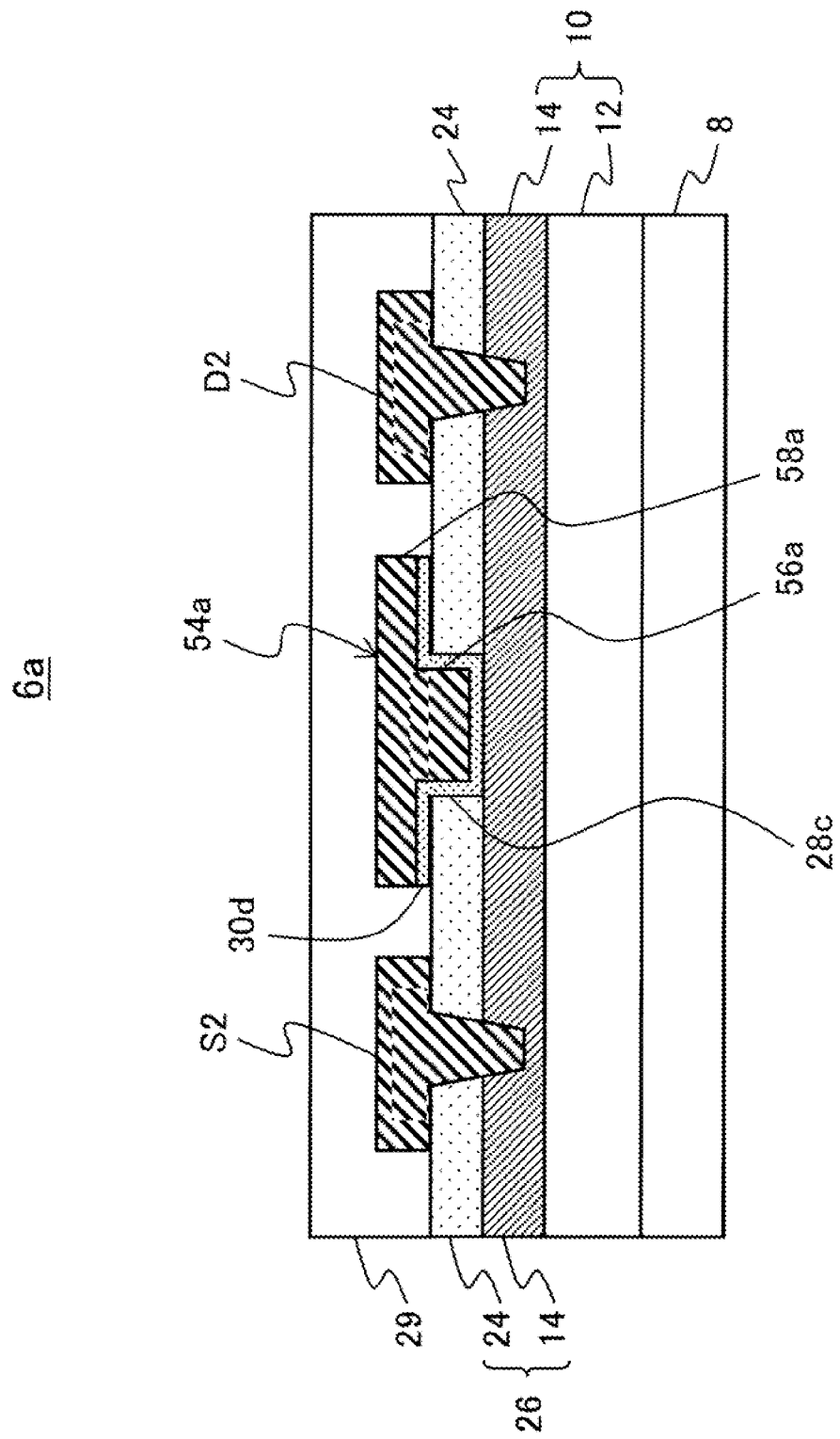
FIG. 10 illustrates an exemplary cross-sectional view of the second high electron mobility transistor.

FIG. 10 illustrates an exemplary cross-sectional view of the second high electron mobility transistor 6a.

As illustrated in FIG. 10, the second high electron mobility transistor 6a includes a first compound semiconductor film (channel layer 12) and a laminated film 26. In the laminated film 26, a second compound semiconductor film (a barrier layer 14) and a first insulating film 24 are laminated.

The second high electron mobility transistor 6a includes a second electrode 54a disposed between the second source S2 and the second drain D2. The second electrode 54a includes a plate-shaped first portion 56a embedded in a second recess 28c formed on the laminated film 26 with a certain length (for example, 0.1 to several μm). Also, the second electrode 54a includes a plate-shaped second portion 58a extending on both the first portion 56a and the first insulating film 24.

Between the second electrode 54a and the laminated film 26, a fourth gate insulating layer 30d is provided. In the example illustrated in FIG. 10, the second recess 28c reaches the surface of the barrier layer 14. However, the second recess 28c may be stopped inside the first insulating film 24. When the second recess 28c is stopped inside the first insulating film 24, the fourth gate insulating layer 30d may be omitted.

The first portion 56a is the second gate G2. The second portion 58a is the third field plate FP3. The first portion 56a and the second portion 58a are integrally formed and coupled to each other.

A portion of the third field plate FP3 (the second portion 58a) extends between the second gate G2 (the first portion 56a) and the second drain D2, as illustrated in FIG. 10. The above portion functions as a field plate, and limits a potential at a boundary between with the second gate G2 to the threshold absolute value of the third field plate FP3, or to that degree.

In other words, the second electrode 54a is an electrode in which the second gate G2 and the third field plate FP3 are combined.

(4) Manufacturing Method

FIGS. 11A through 15B are a process cross section illustrating an exemplary method for manufacturing a transistor circuit according to the present embodiment.

Figure 14A:
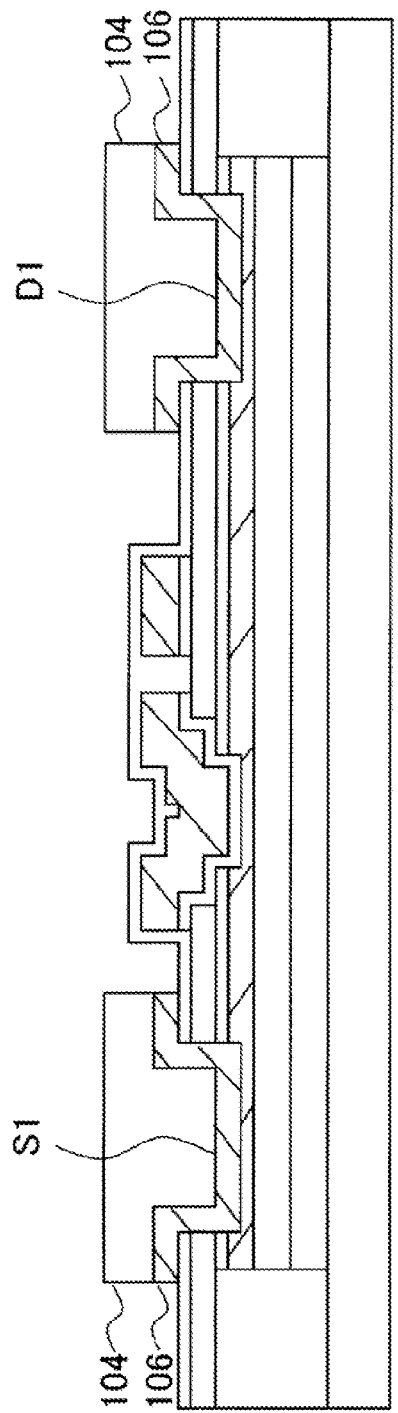
FIG. 14A is a process cross section illustrating an exemplary method for manufacturing a transistor circuit according to the embodiment 3.
Figure 14B:
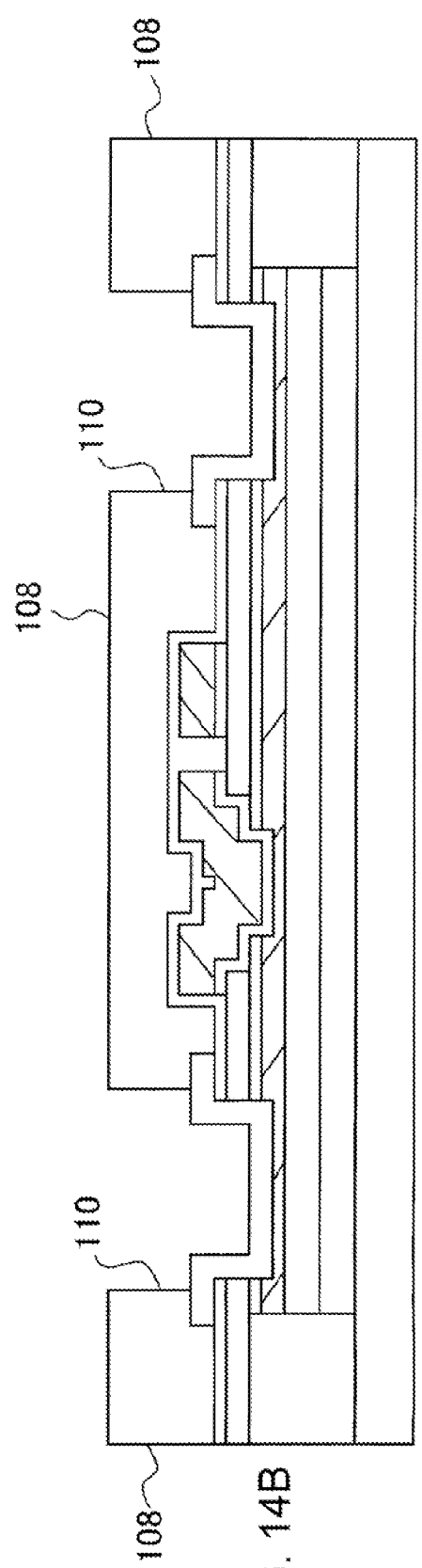
FIG. 14B is a process cross section illustrating an exemplary method for manufacturing a transistor circuit according to the embodiment 3.
Figure 15A:
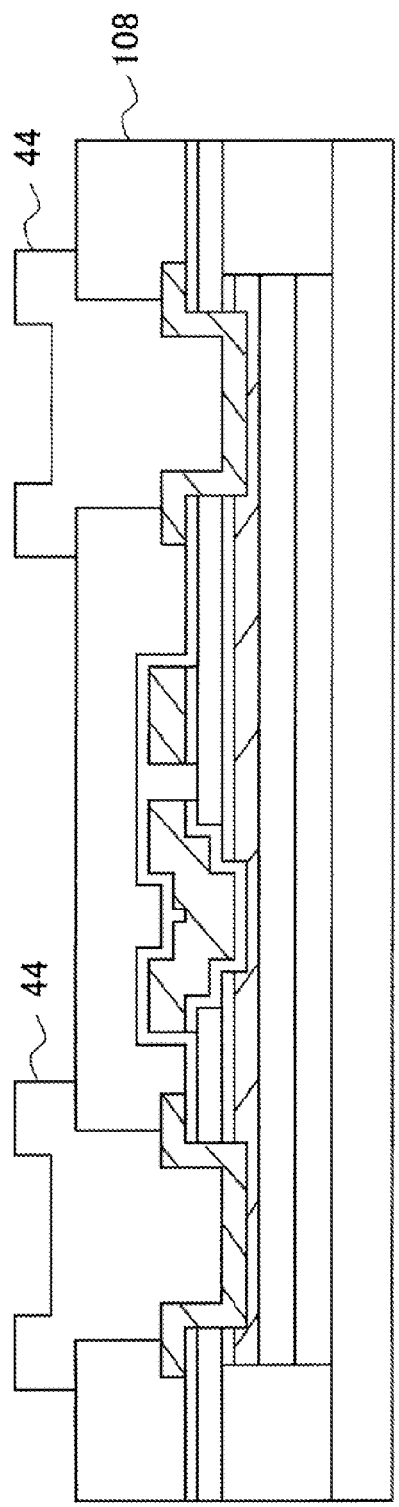
FIG. 15A is a process cross section illustrating an exemplary method for manufacturing a transistor circuit according to the embodiment 3.
Figure 15B:
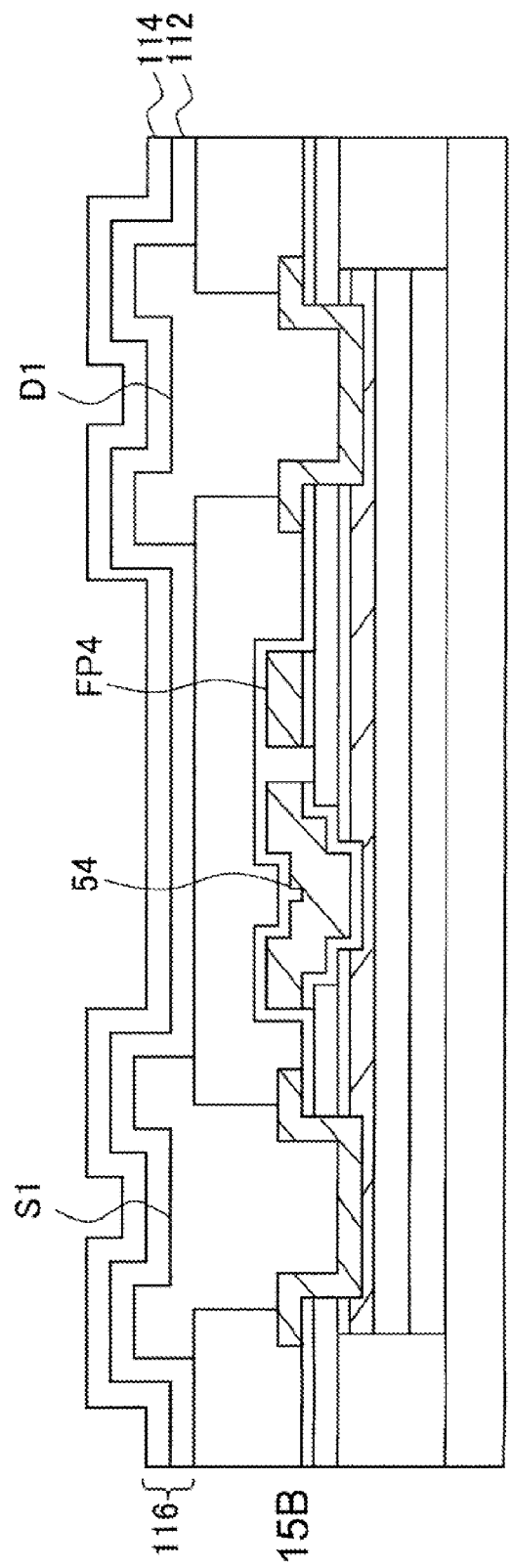
FIG. 15B is a process cross section illustrating an exemplary method for manufacturing a transistor circuit according to the embodiment 3.

In the manufacturing processes illustrated in FIG. 11A through FIG. 15B, the method for manufacturing a transistor circuit further having a fourth field plate FP4 between the first electrode 54 and the first drain D1 is described, as illustrated in FIG. 15B. The fourth field plate FP4 is coupled to the first source S1.

Figure 11A:
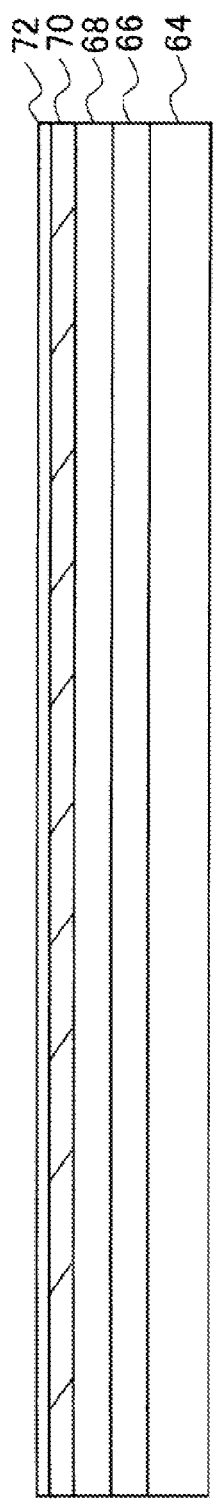
FIG. 11A is a process cross section illustrating an exemplary method for manufacturing a transistor circuit according to the embodiment 3.

First, as illustrated in FIG. 11A, a Si substrate 64 is prepared. The Si substrate is a p-type (111) substrate, for example. By use of a metal organic chemical vapor deposition etc., the following layers are successively grown on the above Si substrate 64: an AlN buffer layer 66; a GaN layer (first compound semiconductor film) 68 with a thickness of the order of 20-40 nm, for example; an AlGaN layer (second compound semiconductor film) 70 with a thickness of the order of 10-30 nm, for example; and a GaN layer 72 with a thickness of the order of 2-8 nm, for example. Here, the above GaN layer 72 may be omitted.

Figure 11B:
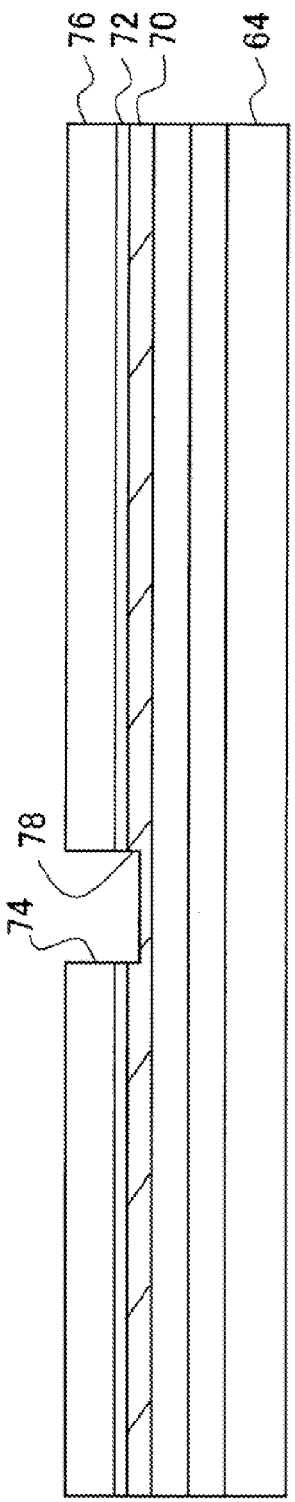
FIG. 11B is a process cross section illustrating an exemplary method for manufacturing a transistor circuit according to the embodiment 3.

Next, as illustrated in FIG. 11B, a photoresist film 76 having an aperture 74 corresponding to the first embedded portion 60 is formed on the GaN layer 72. By use of the photoresist film 76 as a mask, a first recess region 78 reaching the AlGaN layer 70 is formed by dry etching. A first width of the first recess region 78 corresponding to the second embedded portion 62 is in the order of 0.1 to several μm, for example.

Figure 11C:
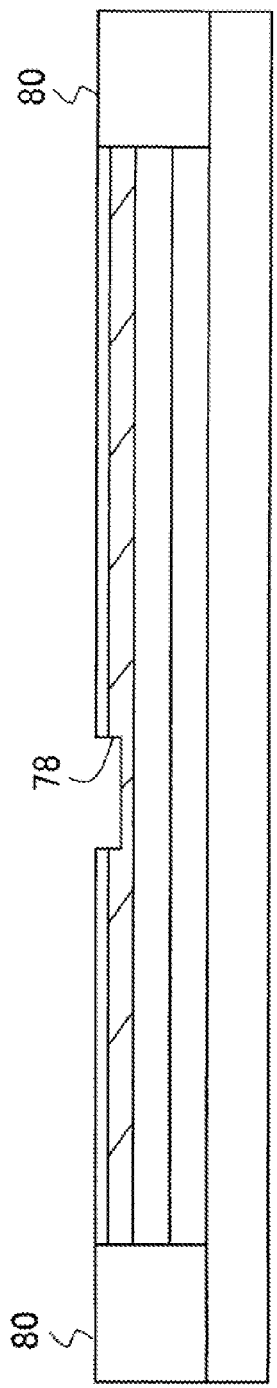
FIG. 11C is a process cross section illustrating an exemplary method for manufacturing a transistor circuit according to the embodiment 3.

After the photoresist film 76 is removed, SiN (not illustrated) for preventing channeling is formed on the GaN layer 72 and the first recess region 78. On the SiN film, a photoresist film (not illustrated) having an aperture corresponding to a device isolation region 80 is formed. By use of the photoresist film as a mask, an Ar ion is injected at 100 kV, so that the device isolation region 80 is formed as illustrated in FIG. 11C.

Figure 12A:
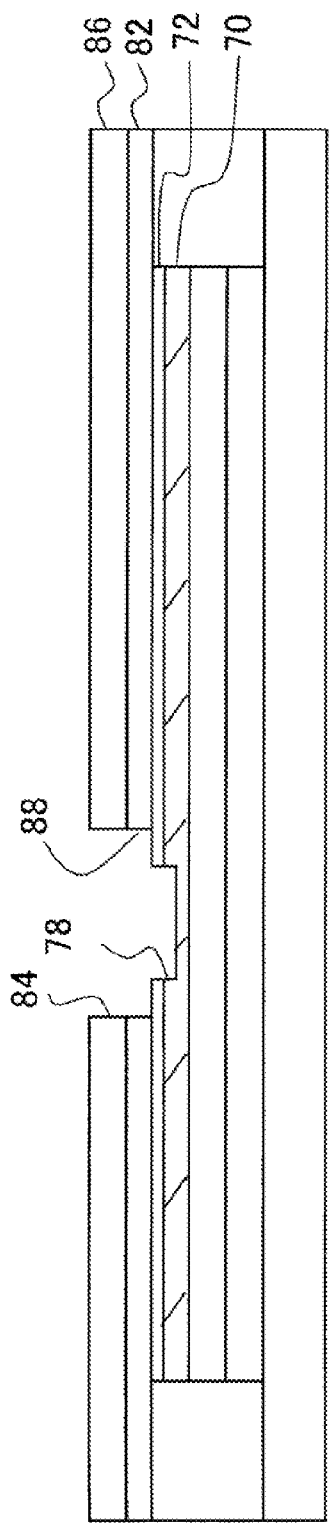
FIG. 12A is a process cross section illustrating an exemplary method for manufacturing a transistor circuit according to the embodiment 3.

After the SiN for preventing channeling is removed, as illustrated in FIG. 12A, a SiN film (first insulating film) 82 with a thickness of 200-400 nm is formed on the AlGaN layer 70 having the formed first recess region 78, and the GaN layer 72, by a plasma CVD (chemical vapor deposition) method.

Further, on the SiN layer 82, a photoresist film 86 having an aperture 84 corresponding to the second embedded portion 62 of the first high electron mobility transistor 4a is formed. On the photoresist film 86, an aperture (not illustrated) corresponding to the first portion 56a of the second high electron mobility transistor 6a is also provided.

By dry etching the SiN film 82 using the photoresist film 86 as a mask, a second recess region 88, having a second width (for example, in the order 0.2 to several μm) wider than the first width of the first recess region 78, is formed on the SiN film 82. By this, the first recess region 78 and the compound semiconductor layer on both sides of the first recess region are exposed.

Figure 12B:
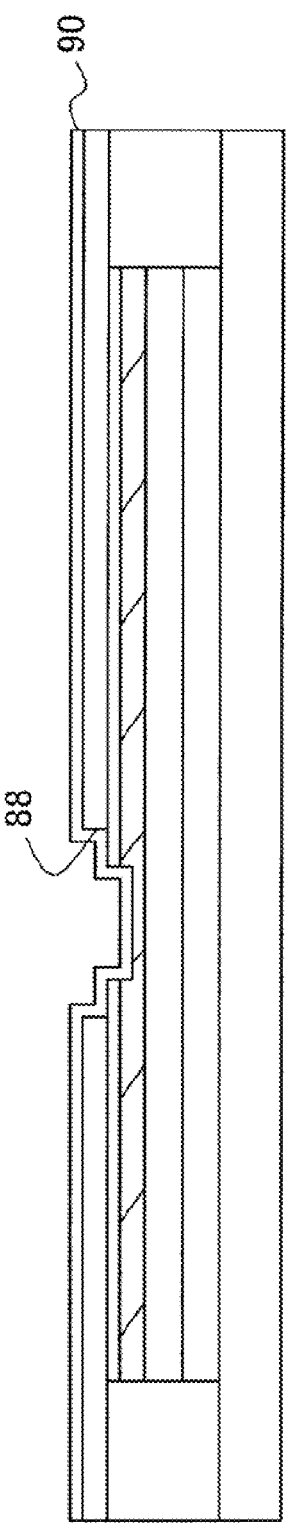
FIG. 12B is a process cross section illustrating an exemplary method for manufacturing a transistor circuit according to the embodiment 3.

After the photoresist film 86 is removed, an AlN film having a thickness of, for example, 15-25 nm and a SiN film having a thickness of, for example, 15-25 nm are successively deposited on the surfaces of the SiN film (the first insulating film) 82, having the formed second recess region 88, and the exposed first recess region 78. By this, as illustrated in FIG. 12B, an insulating layer 90 is formed, which becomes a third gate insulating layer 30c. The above AlN film and the SiN film are formed by the ALD (atomic layer deposition) method and the plasma CVD method, respectively.

Figure 12C:
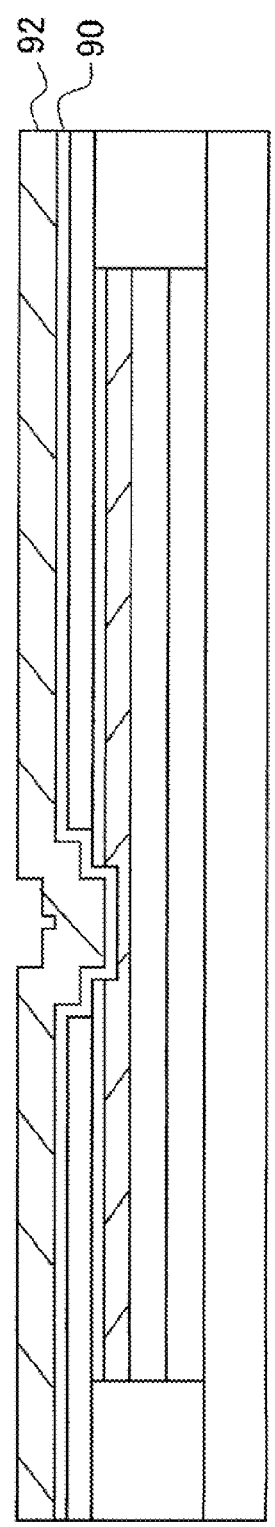
FIG. 12C is a process cross section illustrating an exemplary method for manufacturing a transistor circuit according to the embodiment 3.

By successively depositing TaN with a thickness of, for example, 40-60 nm and an Al film with a thickness of, for example, 300-500 nm on the above insulating layer 90, a conductive film 92 is formed, as illustrated in FIG. 12C.

On the conductive film 92, resist films 94 corresponding to the first and the second electrodes 54, 54a of the first and the second high electron mobility transistors 4a, 6a are formed. Such a resist film 94 is also formed at the formation position of the fourth field plate FP4.

By dry etching the conductive film 92 and the insulating layer 90 using the resist films 94 as masks, the first electrode 54, the second electrode 54a (not illustrated), the fourth field plate FP4 and the third through the fourth insulating layers 30c-30e are formed, as illustrated in FIG. 13A.

Thereafter, the resist films 94 are removed, and as illustrated in FIG. 13B, a SiO$_2$ film 96 having a thickness of, for example, 200-400 nm is formed by the CVD method, using TEOS (tetraethyl orthosilicate) as a raw material.

On the SiO₂ film 96, resist films 100 having 4 types of apertures 98 respectively corresponding to the first and the second sources S1, S2 and the first and the second drains D1, D2 (hereafter referred to as the first source S1, the first drain D1, etc.) are formed. Using the resist films 100 as masks, contact holes 102 reaching inside the AlGaN layer 70 are formed, as illustrated in FIG. 13C.

Thereafter, the resist films 100 are removed, and a metal layer is formed by successively depositing a Ti film and an Al film by the sputtering method. On the metal layer, 4 types of resist films 104 corresponding to the first source S1, the first drain D1, etc. are formed. Using the resist films 104 as masks, a metal layer 106 is etched by dry etching, so that the first source S1, the first drain D1, etc. are formed, as illustrated in FIG. 14A.

After the resist films 104 are removed, a SiO₂ film 108 having a thickness of the order of 1 μm is formed by the CVD method, using TEOS as a raw material. On the SiO₂ film 108, contact holes corresponding to the extraction electrodes 110 of the first source S1, the first drain D1, etc. are formed, as illustrated in FIG. 14B.

On the contact holes 110 and the SiO₂ film 108, for example, a Ti film and an Al film having a thickness of the order 3 μm are deposited successively. Thereafter, by shaping the Ti film and the Al film by the photolithography method, extraction electrodes 44 are formed, as illustrated in FIG. 15A. At this time, the source terminal ST, the gate terminal GT, the drain terminal DT and the wirings 42a-42c (refer to FIG. 6) are also formed.

Thereafter, a SiO₂ film 112 and a SiN film 114 are successively deposited as illustrated in FIG. 15B, so that a cover film 116 is formed. Finally, on the cover film 116, apertures (not illustrated) corresponding to the source terminal ST, the gate terminal GT and the drain terminal DT are formed.

According to the present manufacturing method, the second recess region 88 is formed on the SiN film (the first insulating film) 82 which covers the first recess region 78 (refer to FIG. 12A). The width of the second recess region 88 is greater than the width of the first recess region 78. Therefore, it is easy to adjust a reticle position corresponding to the second recess region 88, relative to the first recess region 78. Thus, according to the present manufacturing method, it is easily possible to form the first and the second electrodes 54, 54a.

According to the above-mentioned semiconductor devices 2-2d, it is possible to increase the withstand voltage of the high electron mobility transistor.

In the above-mentioned embodiments 1 through 3, the semiconductor heterojunction 10 is the GaN/AlGaN heterojunction. However, the semiconductor heterojunction 10 may also be other semiconductor heterojunctions. For example, the semiconductor heterojunction 10 may be a GaAs/AlGaAs heterojunction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transistor circuit comprising:
   a first high electron mobility transistor; and
   a second high electron mobility transistor having a negative threshold voltage,
   wherein a source of the second high electron mobility transistor is coupled to a gate of the first high electron mobility transistor, and
   a gate of the second high electron mobility transistor is coupled to a source of the first high electron mobility transistor.

2. The transistor circuit according to claim 1,
   wherein the first high electron mobility transistor includes a first field plate including at least a portion extending between the gate and the drain thereof.

3. The transistor circuit according to claim 2,
   wherein the first high electron mobility transistor further includes a second field plate including at least a portion extending between the first field plate and the drain thereof.

4. The transistor circuit according to claim 1,
   wherein the second high electron mobility transistor includes a field plate including at least a portion extending between the gate and the drain thereof and being coupled to the source of the first high electron mobility transistor.

5. The transistor circuit according to claims 1, further comprising:
   a third high electron mobility transistor coupled in series to the second high electron mobility transistor,
   wherein the third high electron mobility transistor includes a gate coupled to the drain of the first high electron mobility transistor, and has a negative threshold voltage.

6. The transistor circuit according to claim 1,
   wherein the second high electron mobility transistor limits a voltage between the source and the gate of the first high electron mobility transistor to a voltage smaller than a gate withstand voltage of the first high electron mobility transistor.

* * * * *